United States Patent
Hertzberg et al.

(10) Patent No.: US 11,615,333 B2
(45) Date of Patent: Mar. 28, 2023

(54) QUANTUM CIRCUIT TOPOLOGY SELECTION BASED ON FREQUENCY COLLISIONS BETWEEN QUBITS

(71) Applicant: International Business Machines Corporation, Armonk, NY (US)

(72) Inventors: Jared Barney Hertzberg, Yorktown Heights, NY (US); Rasit Onur Topaloglu, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 901 days.

(21) Appl. No.: 16/449,976

(22) Filed: Jun. 24, 2019

(65) Prior Publication Data
US 2020/0401925 A1    Dec. 24, 2020

(51) Int. Cl.
*G06N 10/00* (2022.01)
*G06F 16/901* (2019.01)
*G06F 30/20* (2020.01)

(52) U.S. Cl.
CPC ......... *G06N 10/00* (2019.01); *G06F 16/9024* (2019.01); *G06F 30/20* (2020.01)

(58) Field of Classification Search
CPC ...... G06F 30/00; G06F 16/9024; G06F 30/20; G06F 30/30; G06N 10/00
USPC ........................ 706/62; 703/14, 13
See application file for complete search history.

(56) References Cited

U.S. PATENT DOCUMENTS

| | | | |
|---|---|---|---|
| 7,353,148 B1 | 4/2008 | Meyers et al. | |
| 7,930,152 B2 | 4/2011 | Coffey et al. | |
| 9,443,200 B2 | 9/2016 | Schroff | |
| 9,812,836 B1 | 11/2017 | Osborn | |
| 2012/0072191 A1* | 3/2012 | Freedman | H04L 9/0852 703/2 |

FOREIGN PATENT DOCUMENTS

WO    2016044917    3/2016

OTHER PUBLICATIONS

Hutchings, M.D. et al., "Tunable Superconducting Qubits with Flux-Independent Coherence", Oct. 12, 2017, Physical Review Applied 8, American Physical Society. (Year: 2017).*

(Continued)

*Primary Examiner* — Cedric Johnson
(74) *Attorney, Agent, or Firm* — Amin, Turocy & Watson, LLP

(57) ABSTRACT

Systems, computer-implemented methods, and computer program products that can facilitate quantum circuit topology selection based on frequency collisions between qubits, are described. According to an embodiment, a system can comprise a memory that stores computer executable components and a processor that executes the computer executable components stored in the memory. The computer executable components can comprise a simulation component that simulates operation of qubits in a subgraph topology of a graph representing a topology of a quantum circuit to determine a quantity of frequency collisions between the qubits. The computer executable components can further comprise a selection component that selects a quantum circuit topology based on the quantity of frequency collisions between the qubits.

30 Claims, 12 Drawing Sheets

(56) References Cited

OTHER PUBLICATIONS

Wootton, James R. et al., "Braiding Majoranas in a Five Qubit Experiment", Sep. 27, 2016. (Year: 2016).*
Bhattacharjee, Debjyoti et al., "MUQUT: Multi-Constraint Quantum Circuit Mapping on NISQ Computers", 2019, IEEE. (Year: 2019).*
Chamberland, Christopher et al., "Topological and Subsystem Codes on Low Degree Graphs Flag Qubits", Jan. 31, 2020, Physical Review X 10, American Physical Society. (Year: 2020).*
Li, Gushu et al., "Towards Efficient Superconducting Quantum Processor Architecture Design", Mar. 16-20, 2020, ASPLOS '20. (Year: 2020).*
Rybar et al., Simulation of indivisible qubit channels in collision models, Journal of Physics B Atomic Molecular and Optical Physics, Feb. 28, 2012, 6 Pages.
Williams et al., Finding Four-Node Subgraphs in Triangle Time, Last accessed on May 1, 2019, 10 Pages.
Hertzberg, et al., Frequency Allocation in Multi-Qubit Circuits, Unpublished U.S. Appl. No. 16/002,817, 52 Pages, Filed Jun. 7, 2018.

* cited by examiner

QUANTUM CIRCUIT TOPOLOGY SELECTION BASED ON FREQUENCY COLLISIONS BETWEEN QUBITS

BACKGROUND

The subject disclosure relates to quantum circuit topology selection, and more specifically, to quantum circuit topology selection based on frequency collisions between qubits.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, computer-implemented methods, and/or computer program products that can facilitate quantum circuit topology selection based on frequency collisions between qubits are described.

According to an embodiment, a system can comprise a memory that stores computer executable components and a processor that executes the computer executable components stored in the memory. The computer executable components can comprise a simulation component that simulates operation of qubits in a subgraph topology of a graph representing a topology of a quantum circuit to determine a quantity of frequency collisions between the qubits. The computer executable components can further comprise a selection component that selects a quantum circuit topology based on the quantity of frequency collisions between the qubits.

According to another embodiment, a computer-implemented method can comprise simulating, by a system operatively coupled to a processor, operation of qubits in a subgraph topology of a graph representing a topology of a quantum circuit to determine a quantity of frequency collisions between the qubits. The computer-implemented method can further comprise selecting, by the system, a quantum circuit topology based on the quantity of frequency collisions between the qubits.

According to another embodiment, a computer program product that can facilitate quantum circuit topology selection based on frequency collisions between qubits. The computer program product can comprise a computer readable storage medium having program instructions embodied therewith, the program instructions can be executable by a processor to cause the processor to simulate, by the processor, operation of qubits in a subgraph topology of a graph representing a topology of a quantum circuit to determine a quantity of frequency collisions between the qubits. The program instructions can be further executable by the processor to cause the processor to select, by the processor, a quantum circuit topology based on the quantity of frequency collisions between the qubits.

According to an embodiment, a system can comprise a memory that stores computer executable components and a processor that executes the computer executable components stored in the memory. The computer executable components can comprise a simulation component that simulates operation of qubits in multiple types of subgraph topologies of a graph representing a topology of a quantum circuit to determine quantities of different types of frequency collisions between the qubits. The computer executable components can further comprise a selection component that selects a quantum circuit topology based on the quantities of the different types of frequency collisions between the qubits.

According to another embodiment, a computer-implemented method can comprise simulating, by a system operatively coupled to a processor, operation of qubits in multiple types of subgraph topologies of a graph representing a topology of a quantum circuit to determine quantities of different types of frequency collisions between the qubits. The computer-implemented method can further comprise selecting, by the system, a quantum circuit topology based on the quantities of the different types of frequency collisions between the qubits.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. It is noted that the drawings of the present application are provided for illustrative purposes only and, as such, the drawings are not drawn to scale.

Due to various gate operations and/or physical events associated with a quantum circuit (e.g., a superconducting circuit), the frequencies of two or more quantum bits (also referred to as qubits and/or qbits) of the quantum circuit can become closer to the same frequency (e.g., can converge to the same frequency), which can cause a collision of the frequencies of the qubits. Such frequency collision can cause the qubits to become coupled (e.g., communicatively, electrically, operationally, optically, physically, etc.) to each other and/or function in an unintended manner, which can alter and/or destroy information (e.g., computation data) of one or more of the qubits. Such frequency collisions between the qubits in a quantum architecture result in gate errors.

Therefore, quantum architectures should be designed to limit and/or eliminate such frequency collisions between qubits of a quantum circuit. For example, quantum architectures should be designed such that each qubit of the quantum architecture (or as many as possible) operate at a unique frequency with respect to all other qubits of such a quantum circuit. However, full-scale simulation of a new quantum architecture is time consuming and scaling beyond 100 qubits would be quite challenging. One may start with 10's of architectures to compete against each other, and this would also scale the runtime requirements. Existing technologies that simulate new quantum architectures (e.g., Monte Carlo simulation) are not efficient.

Figure 1:
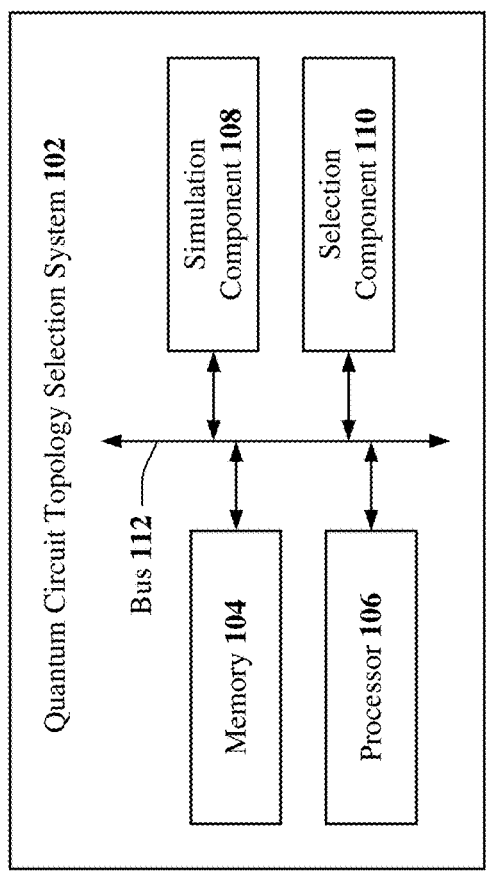
FIG. 1 illustrates a block diagram of an example, non-limiting system that can facilitate quantum circuit topology selection based on frequency collisions between qubits in accordance with one or more embodiments described herein.

FIG. 1 illustrates a block diagram of an example, non-limiting system 100 that can facilitate quantum circuit topology selection based on frequency collisions between qubits in accordance with one or more embodiments described herein. In some embodiments, system 100 can comprise a quantum circuit topology selection system 102. In some embodiments, quantum circuit topology selection system 102 can comprise a memory 104, a processor 106, a simulation component 108, a selection component 110, and/or a bus 112.

It should be appreciated that the embodiments of the subject disclosure depicted in various figures disclosed herein are for illustration only, and as such, the architecture of such embodiments are not limited to the systems, devices, and/or components depicted therein. For example, in some embodiments, system 100 and/or quantum circuit topology selection system 102 can further comprise various computer and/or computing-based elements described herein with reference to operating environment 1000 and FIG. 10. In several embodiments, such computer and/or computing-based elements can be used in connection with implementing one or more of the systems, devices, components, and/or computer-implemented operations shown and described in connection with FIG. 1 or other figures disclosed herein.

According to multiple embodiments, memory 104 can store one or more computer and/or machine readable, writable, and/or executable components and/or instructions that, when executed by processor 106, can facilitate performance of operations defined by the executable component(s) and/or instruction(s). For example, memory 104 can store computer and/or machine readable, writable, and/or executable components and/or instructions that, when executed by processor 106, can facilitate execution of the various functions described herein relating to quantum circuit topology selection system 102, simulation component 108, selection component 110, and/or another component associated with system 100 and/or quantum circuit topology selection system 102, as described herein with or without reference to the various figures of the subject disclosure.

In some embodiments, memory 104 can comprise volatile memory (e.g., random access memory (RAM), static RAM (SRAM), dynamic RAM (DRAM), etc.) and/or non-volatile memory (e.g., read only memory (ROM), programmable ROM (PROM), electrically programmable ROM (EPROM), electrically erasable programmable ROM (EEPROM), etc.) that can employ one or more memory architectures. Further examples of memory 104 are described below with reference to system memory 1016 and FIG. 10. Such examples of memory 104 can be employed to implement any embodiments of the subject disclosure.

According to multiple embodiments, processor 106 can comprise one or more types of processors and/or electronic circuitry that can implement one or more computer and/or machine readable, writable, and/or executable components and/or instructions that can be stored on memory 104. For example, processor 106 can perform various operations that can be specified by such computer and/or machine readable, writable, and/or executable components and/or instructions including, but not limited to, logic, control, input/output (I/O), arithmetic, and/or the like. In some embodiments, processor 106 can comprise one or more central processing unit, multi-core processor, microprocessor, dual microprocessors, microcontroller, System on a Chip (SOC), array processor, vector processor, and/or another type of processor. Further examples of processor 106 are described below with reference to processing unit 1014 and FIG. 10. Such examples of processor 106 can be employed to implement any embodiments of the subject disclosure.

In some embodiments, quantum circuit topology selection system 102, memory 104, processor 106, simulation component 108, selection component 110, and/or another component of quantum circuit topology selection system 102 as described herein can be coupled (e.g., communicatively, electrically, operationally, optically, physically, etc.) to one another via a bus 112 to perform functions of system 100, quantum circuit topology selection system 102, and/or any components coupled therewith. In several embodiments, bus 112 can comprise one or more memory bus, memory controller, peripheral bus, external bus, local bus, and/or another type of bus that can employ various bus architectures. Further examples of bus 112 are described below with reference to system bus 1018 and FIG. 10. Such examples of bus 112 can be employed to implement any embodiments of the subject disclosure.

In some embodiments, quantum circuit topology selection system 102 can comprise any type of component, machine, device, facility, apparatus, and/or instrument that comprises a processor and/or can be capable of effective and/or operative communication with a wired and/or wireless network. All such embodiments are envisioned. For example, quantum circuit topology selection system 102 can comprise a server device, a computing device, a general-purpose computer, a special-purpose computer, a quantum computing device (e.g., a quantum computer, a quantum processor, etc.), a tablet computing device, a handheld device, a server class computing machine and/or database, a laptop computer, a notebook computer, a desktop computer, a cell phone, a smart phone, a consumer appliance and/or instrumentation, an industrial and/or commercial device, a digital assistant, a multimedia Internet enabled phone, a multimedia players, and/or another type of device.

In some embodiments, quantum circuit topology selection system 102 can be coupled (e.g., communicatively, electrically, operationally, optically, physically, etc.) to one or more external systems, sources, and/or devices (e.g., computing devices, communication devices, etc.) via a data cable (e.g., coaxial cable, High-Definition Multimedia Interface (HDMI), recommended standard (RS) 232, Ethernet cable, etc.). In some embodiments, quantum circuit topology selection system 102 can be coupled (e.g., communicatively, electrically, operationally, optically, physically, etc.) to one or more external systems, sources, and/or devices (e.g., computing devices, communication devices, etc.) via a network.

According to multiple embodiments, such a network can comprise wired and wireless networks, including, but not limited to, a cellular network, a wide area network (WAN) (e.g., the Internet) or a local area network (LAN). For example, quantum circuit topology selection system 102 can communicate with one or more external systems, sources, and/or devices, for instance, computing devices (and vice versa) using virtually any desired wired or wireless technology, including but not limited to: wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (IPv6 over Low power Wireless Area Networks), Z-Wave, an ANT, an ultra-wideband (UWB) standard protocol, and/or other proprietary and non-proprietary communication protocols. In such an example, quantum circuit topology selection system 102 can thus include hardware (e.g., a central processing unit (CPU), a transceiver, a decoder), software (e.g., a set of threads, a set of processes, software in execution) or a combination of hardware and software that facilitates communicating information between quantum circuit topology selection system 102 and external systems, sources, and/or devices (e.g., computing devices, communication devices, etc.).

According to multiple embodiments, quantum circuit topology selection system 102 can comprise one or more computer and/or machine readable, writable, and/or executable components and/or instructions that, when executed by processor 106, can facilitate performance of operations defined by such component(s) and/or instruction(s). Further, in numerous embodiments, any component associated with quantum circuit topology selection system 102, as described herein with or without reference to the various figures of the subject disclosure, can comprise one or more computer and/or machine readable, writable, and/or executable components and/or instructions that, when executed by processor 106, can facilitate performance of operations defined by such component(s) and/or instruction(s). For example, simulation component 108, selection component 110, and/or any other components associated with quantum circuit topology selection system 102 as disclosed herein (e.g., communicatively, electronically, operationally, optically, and/or physically coupled with and/or employed by quantum circuit topology selection system 102), can comprise such computer and/or machine readable, writable, and/or executable component(s) and/or instruction(s). Consequently, according to numerous embodiments, quantum circuit topology selection system 102 and/or any components associated therewith as disclosed herein, can employ processor 106 to execute such computer and/or machine readable, writable, and/or executable component(s) and/or instruction(s) to facilitate performance of one or more operations described herein with reference to quantum circuit topology selection system 102 and/or any such components associated therewith.

In some embodiments, quantum circuit topology selection system 102 can facilitate (e.g., via processor 106) performance of operations executed by and/or associated with simulation component 108, selection component 110, and/or another component associated with quantum circuit topology selection system 102 as disclosed herein. For example, as described in detail below, quantum circuit topology selection system 102 can facilitate (e.g., via processor 106): simulating operation of qubits in a subgraph topology of a graph representing a topology of a quantum circuit to determine a quantity of frequency collisions between the qubits; and/or selecting a quantum circuit topology based on the quantity of frequency collisions between the qubits. In some embodiments, quantum circuit topology selection system 102 can further facilitate (e.g., via processor 106): simulating operation of the qubits in the subgraph topology of the graph representing the topology of the quantum circuit to determine the quantity of the frequency collisions between the qubits, where the subgraph topology comprises at least one of a two graph node topology, a three graph node topology, a multiple graph node topology, a rotated version of the subgraph topology, or a defined collision generating topology; generating the graph, where the graph comprises graph nodes representing the qubits and one or more graph edges coupled to the graph nodes representing one or more qubit coupling devices coupled to the qubits; matching the subgraph topology to a collision generating topology; determining a quantity of one or more instances of the subgraph topology in the graph; determining a total quantity of frequency collisions corresponding to the topology of the quantum circuit based on the quantity of the one or more instances of the subgraph topology in the graph and the quantity of frequency collisions between the qubits in the subgraph topology; determining one or more parameters corresponding to at least one of the qubits, the topology of the quantum circuit, or the quantum circuit that provide a defined yield; and/or selecting the quantum circuit topology from a plurality of quantum circuit topologies based on at least one of a defined yield or a defined quantity of frequency collisions between at least two qubits of the plurality of quantum circuit topologies.

In some embodiments, quantum circuit topology selection system 102 can further facilitate (e.g., via processor 106): simulating operation of qubits in multiple types of subgraph topologies of a graph representing a topology of a quantum circuit to determine quantities of different types of frequency collisions between the qubits; and/or selecting a quantum circuit topology based on the quantities of the different types of frequency collisions between the qubits. In some embodiments, quantum circuit topology selection system 102 can further facilitate (e.g., via processor 106): matching one or more of the multiple types of subgraph topologies to one or more collision generating topologies, where the multiple types of subgraph topologies comprise at least one of a two graph node topology, a three graph node topology, a multiple graph node topology, a rotated version of one of the multiple types of subgraph topologies, or a defined collision generating topology; determining a quantity of one or more instances of the multiple types of subgraph topologies in the graph; and/or determining a total quantity of different types of frequency collisions corresponding to the topology of the quantum circuit based on the quantity of the one or more instances of the multiple types of subgraph topologies in the graph and the quantities of the different types of frequency collisions between the qubits in the multiple types of subgraph topologies.

According to multiple embodiments, simulation component 108 can simulate operation of qubits in a subgraph topology of a graph representing a topology of a quantum circuit to determine a quantity of frequency collisions between the qubits. For example, simulation component 108 can comprise a simulation application including, but not limited to, electromagnetic simulation software, an electromagnetic field solver application, and/or another simulation application that can facilitate such simulation described above to determine (e.g., via scale component 502 described above with reference to FIG. 5) a quantity of frequency collisions between the qubits.

In some embodiments, simulation component 108 can simulate operation of a quantum circuit and/or operation of one or more components of a quantum circuit (e.g., qubits, transmission lines, resonators, etc.). In some embodiments, simulation component 108 can simulate one or more parameters of a quantum circuit and/or one or more parameters of one or more components of a quantum circuit. For example, simulation component 108 can simulate one or more parameters including, but not limited to, quantum circuit architecture and/or topology parameters (e.g., quantity of qubits, location of qubits, qubit coupling parameters, etc.), frequency of components (e.g., qubit frequency, transmission line frequency, resonator frequency, etc.), component material (e.g., semiconducting and/or superconducting materials of quantum circuit such as, for instance, substrate material, materials of each qubit, transmission line material, resonator material, etc.), component dimensions (e.g., dimensions of quantum circuit and/or components thereof such as, dimensions of materials of each qubit, dimensions of transmission lines, dimensions of resonators, etc.), and/or another parameter. In some embodiments, simulation component 108 can simulate operation of one or more qubits of a quantum circuit using a single mean frequency for all such one or more qubits, with some random scatter about such a single mean frequency.

Figure 2:
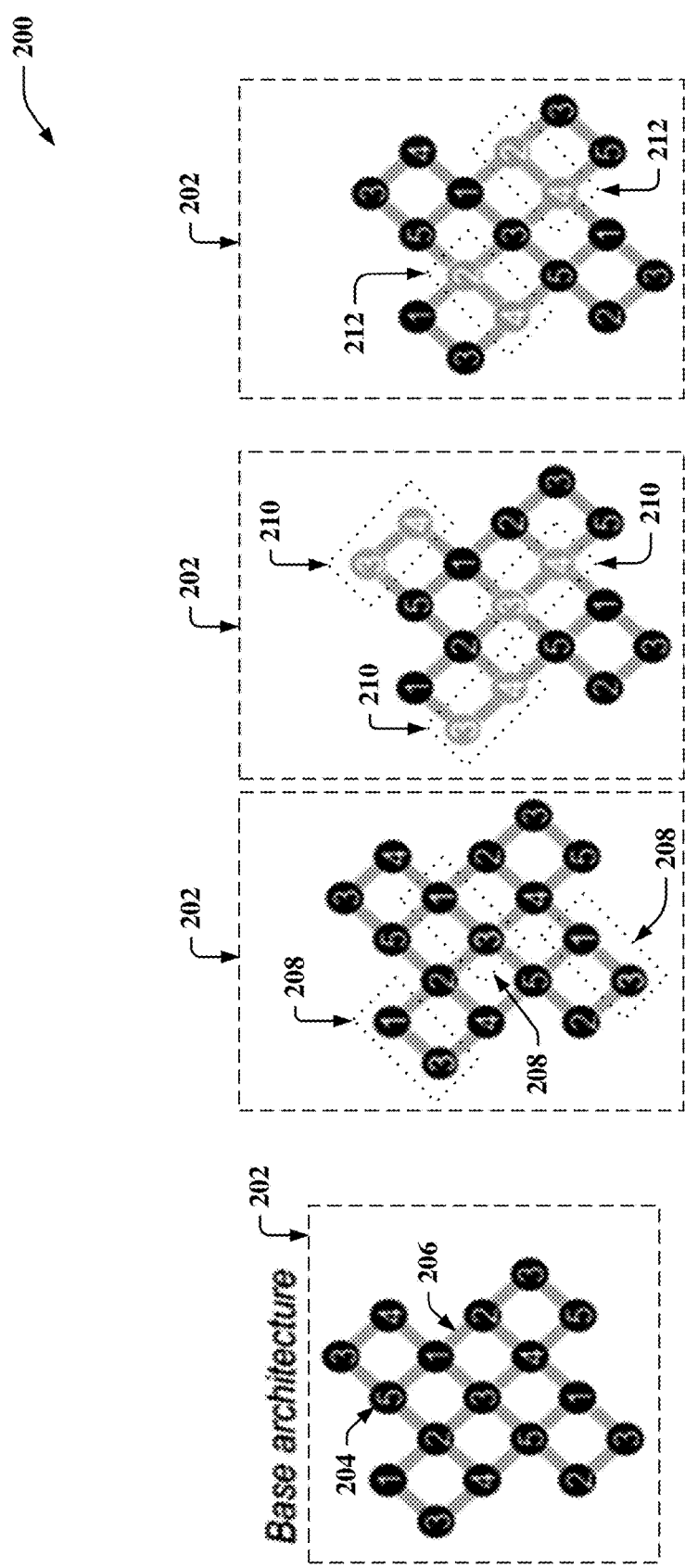
FIG. 2 illustrates a diagram of an example, non-limiting system that can facilitate quantum circuit topology selection based on frequency collisions between qubits in accordance with one or more embodiments described herein.
Figure 2:
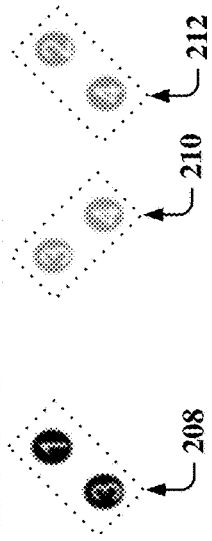

In some embodiments, simulation component 108 can simulate operation of qubits in a subgraph topology of a graph representing a topology of a quantum circuit including, but not limited to, a superconducting circuit, a circuit quantum electrodynamics (circuit QED), and/or another quantum circuit. In some embodiments, such a graph representing a topology of a quantum circuit can comprise graph 202 described below and illustrated in FIG. 2. In some embodiments, such a graph representing a topology of a quantum circuit can comprise graph nodes (e.g., vertices) that can represent qubits of such a quantum circuit. In some embodiments, such a graph representing a topology of a quantum circuit can comprise graph nodes 204 described below and illustrated in FIG. 2. In some embodiments, such a graph representing a topology of a quantum circuit can further comprise one or more graph edges that can be coupled to the graph nodes, where such one or more graph edges can represent one or more qubit coupling devices of the quantum circuit that can be coupled (e.g., communicatively, electrically, operationally, optically, physically, etc.) to the qubits of the quantum circuit. In some embodiments, such one or more graph edges described above can comprise one or more lines extending from one graph node to another. In some embodiments, such a graph representing a topology of a quantum circuit can comprise one or more graph edges 206 described below and illustrated in FIG. 2, where such one or more graph edges 206 can be coupled to one or more graph nodes 204 as depicted in FIG. 2.

In some embodiments, such one or more qubit coupling devices described above can comprise one or more coupling devices that can couple (e.g., communicatively, electrically, operationally, optically, physically, etc.) one qubit of a quantum circuit (e.g., a superconducting circuit, a circuit QED, etc.) to another qubit of the quantum circuit. In some embodiments, such one or more qubit coupling devices described above can include, but are not limited to, a transmission line, a resonant line, a resonator, a bus, a resonant bus, a qubit bus resonator, a superconducting transmission line, a superconducting resonant line, a superconducting resonator, a superconducting bus, a superconducting resonant bus, a superconducting qubit bus resonator, and/or another qubit coupling device.

In some embodiments, such a subgraph topology described above can include, but is not limited to, a two graph node topology, a three graph node topology, a multiple graph node topology, a defined collision generating topology, a rotated version of the subgraph topology (e.g., a rotated version of a three graph node topology, a rotated version of a multiple graph node topology, a rotated version of a defined collision generating topology, etc.), and/or another subgraph topology. In some embodiments, such a defined collision generating topology can comprise a topology (e.g., a subgraph topology) that is currently known, or will be known at some time in the future, to generate (e.g., to cause) frequency collisions between qubits of such a topology. In some embodiments, such a defined collision generating topology can be defined by an entity (e.g., by a human using a graphical user interface (GUI) of quantum circuit topology selection system 102, not illustrated in the figures).

In some embodiments, such a graph described above can comprise one or more of such a subgraph topology defined above. For example, such a graph described above can comprise a single instance or multiple instances of one or more of such a subgraph topology defined above. In some embodiments, such a subgraph topology described above can comprise one or more subgraph topology 208, 210, 212 described below and illustrated in FIG. 2.

In some embodiments, simulation component 108 can simulate operation of qubits in multiple types of subgraph topologies of a graph representing a topology of a quantum circuit to determine quantities of different types of frequency collisions between the qubits. For example, such a graph representing a topology of a quantum circuit (e.g., graph 202 illustrated in FIG. 2 and/or graphs 702a, 702b, 702c illustrated in FIGS. 7A, 7B, 7C, respectively) can comprise multiple types of such subgraph topologies defined above and simulation component 108 can simulate operation of qubits in one or more of such multiple types of subgraph topologies to determine quantities of different types of frequency collisions between the qubits. For instance, such a graph representing a topology of a quantum circuit (e.g., graph 202 illustrated in FIG. 2 and/or graphs 702a, 702b, 702c illustrated in FIGS. 7A, 7B, 7C, respectively) can comprise one or more two graph node topologies, one or more three graph node topologies, one or more multiple graph node topologies, one or more defined collision generating topologies, one or more rotated versions of the subgraph topology (e.g., one or more rotated versions of a three graph node topology, one or more rotated versions of a multiple graph node topology, one or more rotated versions of a defined collision generating topology, etc.), and/or one or more other types of subgraph topologies. In this example, simulation component 108 can simulate operation of qubits in one or more of such multiple types of subgraph topologies defined above that can be present in a graph representing a topology of a quantum circuit to determine quantities of different types of frequency collisions between the qubits.

In some embodiments, such different types of frequency collisions described above can result from different cross resonance (CR) gate degeneracy conditions (e.g., different failure modes of a cross resonance (CR) gate). In some embodiments, such different types of frequency collisions can comprise frequency collisions that can occur between two or more qubits based on configuration of such qubits in a quantum architecture. For example, such different types of frequency collisions can comprise frequency collisions that can occur between two or more qubits based on configuration of such qubits in a quantum architecture, where such configuration can comprise one or more of subgraph topologies 208, 210, 212 illustrated in FIG. 2.

In some embodiments, such different types of frequency collisions can comprise frequency collisions that can occur between two neighboring qubits. For example, such different types of frequency collisions can comprise frequency collisions that can occur between two neighboring qubits that can be modeled as subgraph topologies 208, 210, 212 illustrated in FIG. 2.

In some embodiments, such different types of frequency collisions can comprise frequency collisions that can occur between two neighboring qubits, where such two neighboring qubits are further coupled to two other qubits via at least one resonator (e.g., a superconducting resonator, a superconducting transmission line, etc.). For example, such different types of frequency collisions can comprise frequency collisions that can occur between two neighboring qubits that can be modeled as graph nodes 1 and 2 in graph 702a illustrated in FIG. 7A, where such two neighboring qubits are further coupled (e.g., communicatively, electrically, operationally, optically, physically, etc.) to two other qubits that can be modeled as graph nodes 3 and 0 in graph 702a illustrated in FIG. 7A via at least one resonator.

In some embodiments, such different types of frequency collisions can comprise frequency collisions that can occur between three neighboring qubits, where such three neighboring qubits are further coupled (e.g., communicatively, electrically, operationally, optically, physically, etc.) to multiple other qubits via at least one resonator (e.g., a superconducting resonator, a superconducting transmission line, etc.). For example, such different types of frequency collisions can comprise frequency collisions that can occur between three neighboring qubits that can be modeled as graph nodes 0, 3, and 6 in graph 702b illustrated in FIG. 7B, where such three neighboring qubits are further coupled (e.g., communicatively, electrically, operationally, optically, physically, etc.) to multiple other qubits that can be modeled as graph nodes 1, 2, 4, and 5 in graph 702b illustrated in FIG. 7B via at least one resonator.

According to multiple embodiments, selection component 110 can select a quantum circuit topology based on a quantity of frequency collisions between qubits of such a quantum circuit topology and/or based on quantities of different types of frequency collisions between such qubits. For example, selection component 110 can select a quantum circuit topology based on a total quantity of frequency collisions (e.g., a total quantity of different types of frequency collisions) corresponding to one or more different types of subgraph topologies (e.g., two graph node topology, three graph node topology, multiple graph node topology, rotated versions thereof, etc.) present in a graph representing a topology of a quantum circuit.

In some embodiments, such a total quantity of frequency collisions described above can be determined as described below with reference to model component 302, match component 402, scale component 502, and/or parameter component 602, as well as FIGS. 3, 4, 5, and/or 6, respectively. For example, such a total quantity of frequency collisions corresponding to such one or more different types of subgraph topologies present in such a graph can define: a) generating (e.g., via model component 302) such a graph comprising graph nodes representing qubits and one or more graph edges coupled to the graph nodes representing one or more qubit coupling devices (e.g., a superconducting resonator, a superconducting transmission line, etc.) coupled (e.g., communicatively, electrically, operationally, optically, physically, etc.) to the qubits, where such a graph can comprise such one or more different types of subgraph topologies; b) matching (e.g., via match component 402) such one or more different types of subgraph topologies present in such a graph to one or more defined collision generating topologies (e.g., topologies currently known, or that will be known at some time in the future, to generate (e.g., to cause) frequency collisions between qubits of such a topology); c) calculating (e.g., via scale component 502) the quantity of instances (e.g., the number of times) that each of such one or more subgraph topologies are detected (e.g., appear) in the graph; d) simulating (e.g., via simulation component 108) one or more of such subgraph topologies to determine the quantity and/or type(s) of frequency collisions corresponding to each of such one or more subgraph topologies, where such simulation can be performed based on one or more parameters defined (e.g., via parameter component 602) to yield a desired result; and/or e) multiplying (e.g., via scale component 502) the quantity of each type of frequency collision corresponding to each of such one or more subgraph topologies by the quantity of instances that each of such subgraph topologies are detected in the graph to determine a total quantity of all different types of frequency collisions corresponding to all of such one or more subgraph topologies detected in the graph.

In some embodiments, selection component 110 can select a quantum circuit topology from a plurality of quantum circuit topologies comprising candidate quantum circuit topologies that can each be designed and/or simulated (e.g., via simulation component 108) based on the same or different parameters. In some embodiments, selection component 110 can select a quantum circuit topology from such a plurality of quantum circuit topologies described above based on a defined quantity of frequency collisions between at least two qubits of one or more of the plurality of quantum circuit topologies, where such a defined quantity of such frequency collisions can be defined by an entity (e.g., a human using a GUI of quantum circuit topology selection system 102).

In some embodiments, selection component 110 can select a quantum circuit topology that can facilitate (e.g., enable, cause, etc.) fewer frequency collisions than one or more other quantum circuit topologies that can be simulated by simulation component 108. For instance, selection component 110 can select a quantum circuit topology that can facilitate (e.g., enable, cause, etc.): fewer frequency collisions of one or more certain types of subgraph topologies; fewer different types of frequency collisions corresponding to such one or more certain types of subgraph topologies; and/or fewer total frequency collisions, where such total frequency collisions can account for frequency collisions of such one or more certain types of subgraph topologies and/or such different types of frequency collisions corresponding to the one or more certain types of subgraph topologies. In some embodiments, selection (e.g., by selection component 110) of such a quantum circuit topology that can facilitate (e.g., enable, cause, etc.) fewer frequency collisions can improve the performance of a quantum computer by enabling deeper quantum circuits.

In some embodiments, selection component 110 can select a quantum circuit topology from such a plurality of quantum circuit topologies described above based on a defined yield (e.g., desired yield, desired performance results, etc.), where such a defined yield can be defined by an entity (e.g., a human using a GUI of quantum circuit topology selection system 102). For example, selection component 110 can select a quantum circuit topology that performs better than one or more other quantum circuit topologies that can be simulated by simulation component 108 based on one or more parameters that can be defined by parameter component 602 as described below with reference to FIG. 6. For instance, selection component 110 can select a quantum circuit topology that can facilitate (e.g., enable, cause, etc.) a defined yield including, but not limited to: fewer gate errors; longer quantum decoherence times (e.g., longer time before qubit information is altered and/or destroyed due to frequency collisions); more accurate computation results; faster computation times; lower computational cost; and/or another defined yield that can be facilitated by such a quantum circuit topology based on one or more parameters that can be defined by parameter component 602.

FIG. 2 illustrates a diagram of an example, non-limiting system 200 that can facilitate quantum circuit topology selection based on frequency collisions between qubits in accordance with one or more embodiments described herein. Repetitive description of like elements and/or processes employed in respective embodiments is omitted for sake of brevity.

According to multiple embodiments, system 200 can comprise a graph 202 (denoted as Base architecture in FIG. 2) that can be generated (e.g., via model component 302 as described below with reference to FIG. 3) to model a quantum circuit topology comprising multiple qubits and at least one qubit coupling device (e.g., a superconducting transmission line, resonant bus, etc.) that couples (e.g., communicatively, electrically, operationally, optically, physically, etc.) at least two of such qubits. In some embodiments, graph 202 can comprise multiple graph nodes 204 (denoted as numerical values 1, 2, 3, 4, and 5 in FIG. 2) that can represent such qubits of the quantum circuit topology modeled as graph 202. In some embodiments, graph 202 can comprise one or more graph edges 206 that can represent such qubit coupling device(s) that can couple (e.g., communicatively, electrically, operationally, optically, physically, etc.) such qubits of the quantum circuit topology modeled as graph 202.

In some embodiments, graph nodes 204 denoted in FIG. 2 with the same numerical value (e.g., 1, 2, 3, 4, or 5) can comprise qubits that have the same physical attributes (e.g., dimensions, materials, etc.) and/or qubits that operate at a certain frequency. For example, graph nodes 204 denoted in FIG. 2 with a numerical value of 1 can comprise qubits that comprise a first set of physical attributes and/or that operate at a first frequency. In another example, graph nodes 204 denoted in FIG. 2 with a numerical value of 2 can comprise qubits that comprise a second set of physical attributes and/or that operate at a second frequency. In another example, graph nodes 204 denoted in FIG. 2 with a numerical value of 3 can comprise qubits that comprise a third set of physical attributes and/or that operate at a third frequency, and so on.

In some embodiments, graph 202 can comprise one or more subgraph topologies 208, 210, 212. In some embodiments, subgraph topologies 208, 210, 212 can comprise one or more different types of subgraph topologies (e.g., two graph node topology, three graph node topology, multiple graph node topology, rotated versions thereof, etc.). For example, as illustrated in FIG. 2, subgraph topologies 208, 210, 212 can comprise two graph node topologies; however, it should be appreciated that subgraph topologies 208, 210, 212 can comprise one or more other types of subgraph topologies defined above with reference to FIG. 1. In some embodiments, as illustrated in FIG. 2, subgraph topology 208 can comprise a two graph node topology that can represent two qubits denoted as graph nodes 1 and 3. In some embodiments, as illustrated in FIG. 2, subgraph topology 210 can comprise a two graph node topology that can represent two qubits denoted as graph nodes 3 and 4. In some embodiments, as illustrated in FIG. 2, subgraph topology 212 can comprise a two graph node topology that can represent two qubits denoted as graph nodes 2 and 4.

In some embodiments, graph 202 can comprise one or more instances of subgraph topologies 208, 210, 212. For example, as illustrated in FIG. 2, graph 202 can comprise: 3 instances of subgraph topology 208 (denoted as Number of Occurrence: 3 in FIG. 2); 3 instances of subgraph topology 210 (denoted as Number of Occurrence: 3 in FIG. 2); and/or 2 instances of subgraph topology 212 (denoted as Number of Occurrence: 2 in FIG. 2). In some embodiments, the quantity of instances that each of subgraph topologies 208, 210, 212 appear in graph 202 define a scale component 502 as described below with reference to FIG. 5.

Figure 3:
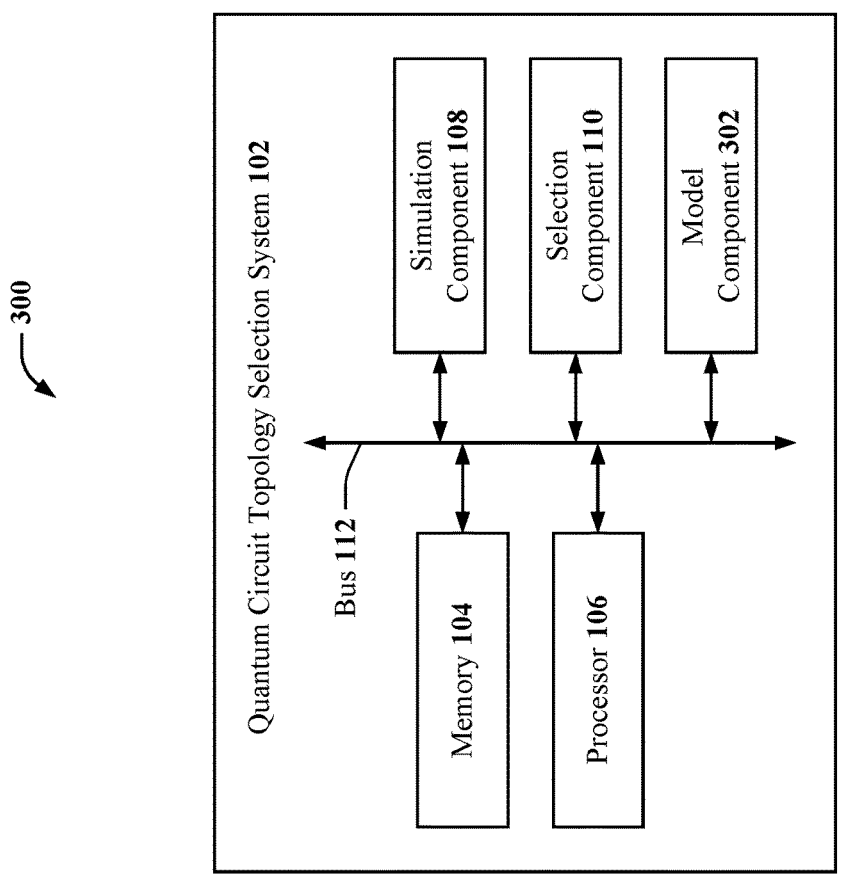
FIG. 3 illustrates a block diagram of an example, non-limiting system that can facilitate quantum circuit topology selection based on frequency collisions between qubits in accordance with one or more embodiments described herein.

FIG. 3 illustrates a block diagram of an example, non-limiting system 300 that can facilitate quantum circuit topology selection based on frequency collisions between qubits in accordance with one or more embodiments described herein. In some embodiments, system 300 can comprise a quantum circuit topology selection system 102. In some embodiments, quantum circuit topology selection system 102 can further comprise a model component 302. Repetitive description of like elements and/or processes employed in respective embodiments is omitted for sake of brevity.

According to multiple embodiments, model component 302 can generate a graph comprising graph nodes representing qubits and one or more graph edges coupled to the graph nodes representing one or more qubit coupling devices coupled to the qubits. For example, model component 302 can generate graph 202 comprising graph nodes 204 representing qubits and one or more graph edges 206 coupled to graph nodes 204 representing one or more qubit coupling devices (e.g., superconducting transmission lines, superconducting resonators, etc.) coupled (e.g., communicatively, electrically, operationally, optically, physically, etc.) to the qubits.

In some embodiments, to generate such a graph (e.g., graph 202), model component 302 can employ one or more mapping techniques. For example, model component 302 can employ one or more graph mapping techniques to generate a graph such as, for instance, graph 202. In some embodiments, model component 302 can employ one or more graph mapping techniques (e.g., one or more graph mapping algorithms) to map a quantum architecture (e.g., topology) of a quantum circuit (e.g., a superconducting circuit) to a graph model by mapping such a quantum architecture to a graph problem.

Figure 4:
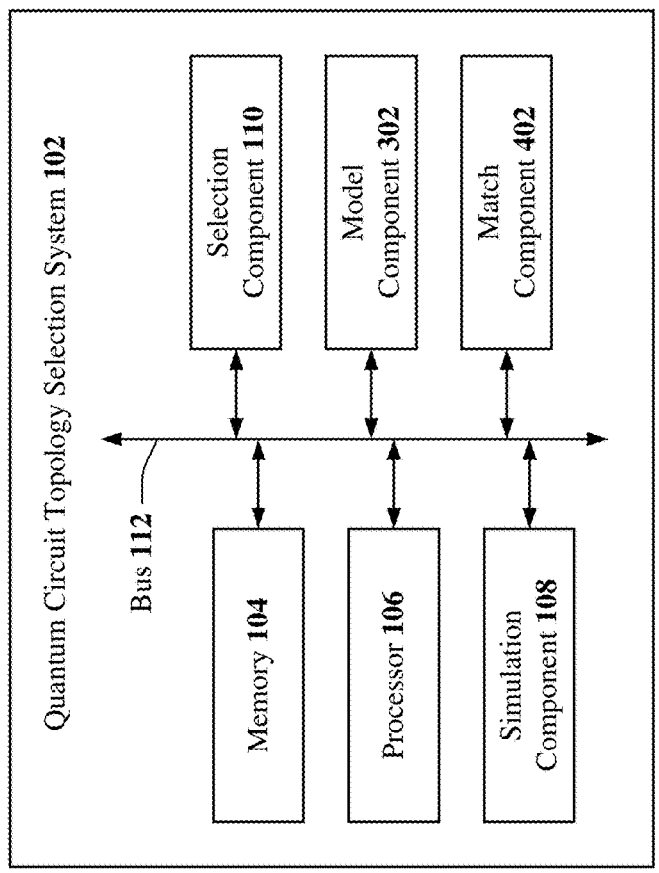
FIG. 4 illustrates a block diagram of an example, non-limiting system that can facilitate quantum circuit topology selection based on frequency collisions between qubits in accordance with one or more embodiments described herein.

FIG. 4 illustrates a block diagram of an example, non-limiting system 400 that can facilitate quantum circuit topology selection based on frequency collisions between qubits in accordance with one or more embodiments described herein. In some embodiments, system 400 can comprise a quantum circuit topology selection system 102. In some embodiments, quantum circuit topology selection system 102 can further comprise a match component 402. Repetitive description of like elements and/or processes employed in respective embodiments is omitted for sake of brevity.

According to multiple embodiments, match component 402 can match one or more subgraph topologies to one or more collision generating topologies. For example, match component 402 can match one or more subgraph topologies (e.g., subgraph topologies 208, 210, 212) to one or more defined collision generating topologies (e.g., topologies currently known, or that will be known at some time in the future, to generate (e.g., to cause) frequency collisions between qubits of such a topology).

In some embodiments, match component 402 can match one or more types of subgraph topologies to one or more collision generating topologies. For example, match component 402 can match one or more types of subgraph topologies to one or more defined collision generating topologies, where such one or more types of subgraph topologies can comprise at least one of a two graph node topology, a three graph node topology, a multiple graph node topology, a rotated version of one of the multiple types of subgraph topologies, or a defined collision generating topology.

In some embodiments, to match such one or more types of subgraph topologies (e.g., subgraph topologies 208, 210, 212) to one or more collision generating topologies (e.g., one or more defined collision generating topologies), match component 402 can employ one or more graph matching techniques and/or one or more graph search techniques. For example, to match such one or more types of subgraph topologies to one or more of such collision generating topologies, match component 402 can employ one or more graph matching algorithms and/or one or more graph search algorithms. For instance, match component 402 can employ one or more graph matching and/or graph search techniques and/or algorithms including, but not limited to, a graph pattern matching algorithm, an exact graph matching technique and/or algorithm (also known as the graph isomorphism problem), an inexact graph matching technique and/or algorithm, incremental graph pattern matching technique and/or algorithm, and/or another graph matching and/or graph search technique and/or algorithm that can facilitate matching such one or more subgraph topologies to one or more of such collision generating topologies.

Figure 5:
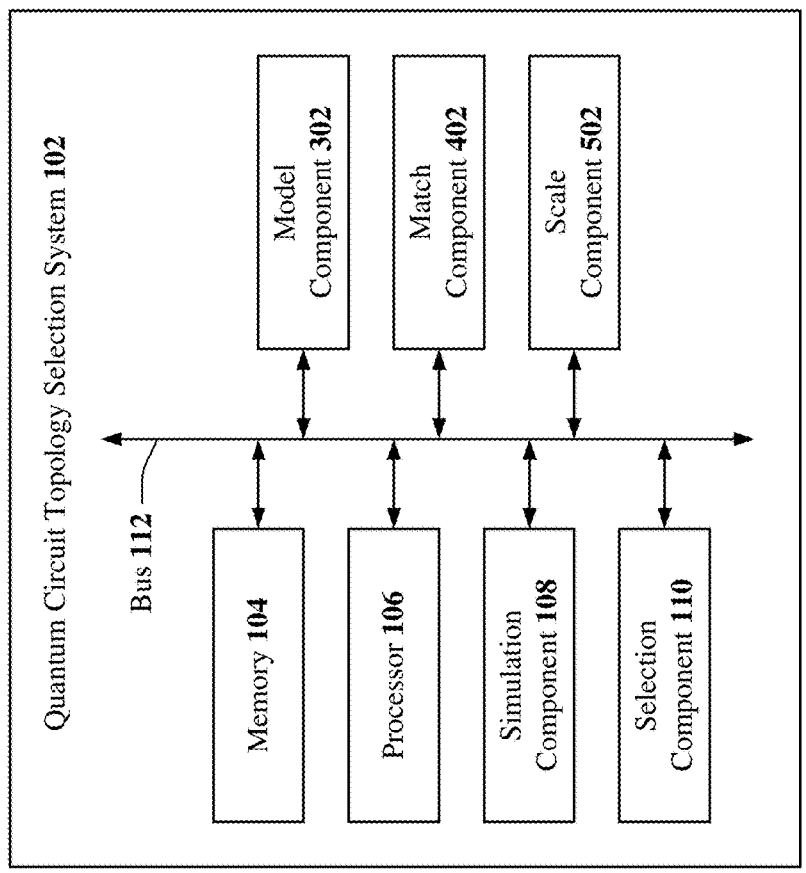
FIG. 5 illustrates a block diagram of an example, non-limiting system that can facilitate quantum circuit topology selection based on frequency collisions between qubits in accordance with one or more embodiments described herein.

FIG. 5 illustrates a block diagram of an example, non-limiting system 500 that can facilitate quantum circuit topology selection based on frequency collisions between qubits in accordance with one or more embodiments described herein. In some embodiments, system 500 can comprise a quantum circuit topology selection system 102. In some embodiments, quantum circuit topology selection system 102 can further comprise a scale component 502. Repetitive description of like elements and/or processes employed in respective embodiments is omitted for sake of brevity.

According to multiple embodiments, scale component 502 can determine a quantity of one or more instances of one or more types of subgraph topologies in a graph. For example, based on matching such one or more types of subgraph topologies to such one or more collision generating topologies as described above with reference to match component 402 and FIG. 4, scale component 502 can count the number of times (e.g., instances) that each of such one or more types of subgraph topologies are detected (e.g., matched via match component 402 and/or identified via scale component 502) in such a graph. For instance, scale component 502 can count the number of instances that each of subgraph topologies 208, 210, 212 appear in graph 202, where subgraph topologies 208, 210, 212 can comprise one or more different types of subgraph topologies (e.g., two graph node topology, three graph node topology, multiple graph node topology, rotated versions thereof, etc.).

In some embodiments, scale component 502 can determine a total quantity of frequency collisions corresponding to a topology of a quantum circuit based on a quantity of one or more instances of a subgraph topology in a graph and a quantity of frequency collisions between qubits in the subgraph topology. For example, based on matching such one or more types of subgraph topologies to such one or more collision generating topologies as described above with reference to match component 402 and FIG. 4, simulation component 108 can simulate operation of qubits represented as graph nodes in each of such one or more types of subgraph topologies to determine a quantity of frequency collisions that correspond to each of such one or more types of subgraph topologies. For instance, simulation component 108 can simulate operation of qubits represented as graph nodes 204 in each of subgraph topologies 208, 210, 212 to determine a quantity of frequency collisions that correspond respectively to each of subgraph topologies 208, 210, 212. In some embodiments, based on such simulation and/or determination (e.g., via simulation component 108) described above, scale component 502 can multiply the number of times each type of subgraph topologies (e.g., each of subgraph topologies 208, 210, 212) appears in the graph (e.g., graph 202) by the number of frequency collisions that correspond to such a subgraph topology. For example, based on such simulation and/or determination (e.g., via simulation component 108) described above, for a certain type of frequency collision that corresponds to a certain type of subgraph topology, scale component 502 can multiply the number of times that such a subgraph topology appears in the graph by the number of frequency collisions of such a certain type that correspond to such a subgraph topology.

In some embodiments, such a process described above that can be performed by scale component 502 can constitute scaling. In some embodiments, such scaling can be performed for each type of subgraph topologies (e.g., subgraph topologies 208, 210, 212) detected in such a graph defined above (e.g., graph 202) to determine a total quantity of different types of frequency collisions corresponding to a topology of a quantum circuit.

In some embodiments, scale component 502 can determine a total quantity of different types of frequency collisions corresponding to a topology of a quantum circuit based on a quantity of one or more instances of multiple types of subgraph topologies in a graph and quantities of different types of frequency collisions between qubits in the multiple types of subgraph topologies. For example, based on matching such one or more types of subgraph topologies to such one or more collision generating topologies as described above with reference to match component 402 and FIG. 4, simulation component 108 can simulate operation of qubits represented as graph nodes in each of such one or more types of subgraph topologies to determine one or more types of frequency collisions and/or a quantity of frequency collisions of each of such one or more types of frequency collisions that correspond to each of such one or more types of subgraph topologies. For instance, simulation component 108 can simulate operation of qubits represented as graph nodes 204 in each of subgraph topologies 208, 210, 212 to determine one or more types of frequency collisions and/or a quantity of frequency collisions of each of such one or more types of frequency collisions that correspond respectively to each of subgraph topologies 208, 210, 212. In some embodiments, based on such simulation and/or determination (e.g., via simulation component 108) described above, for each type of frequency collision that corresponds to each type of subgraph topologies (e.g., each of subgraph topologies 208, 210, 212), scale component 502 can multiply the number of times each type of subgraph topologies appear in the graph (e.g., graph 202) by the number of frequency collisions that correspond to such a subgraph topology. For example, based on such simulation and/or determination (e.g., via simulation component 108) described above, for a certain type of frequency collision that corresponds to a certain type of subgraph topology, scale component 502 can multiply the number of times that such a subgraph topology appears in the graph by the number of frequency collisions of such a certain type that correspond to such a subgraph topology.

In some embodiments, such a process described above that can be performed by scale component 502 can constitute scaling. In some embodiments, such scaling can be performed for each type of subgraph topologies (e.g., subgraph topologies 208, 210, 212) detected in such a graph defined above (e.g., graph 202) and/or for each type of frequency collisions that correspond to each type of subgraph topologies to determine a total quantity of different types of frequency collisions corresponding to a topology of a quantum circuit.

In some embodiments, for example, embodiments comprising a graph (e.g., graph 202) having one or more rotated versions of a certain subgraph topology (e.g., clockwise or counter-clockwise traversal of a certain sequence, arrangement, and/or configuration of qubits), scale component 502 can increment the number of instances that such a certain subgraph topology appears in such a graph. For instance, scale component 502 can add the number of instances that such one or more rotated versions appear in such a graph to the number of instances that such a certain subgraph topology appears in such a graph (e.g., as opposed to counting the number of instances that such one or more rotated versions appear in the graph separately from the number of instances that such a certain subgraph topology appears in the graph). In some embodiments, for example, embodiments comprising a graph (e.g., graph 202) having one or more three graph node topologies, scale component 502 can also count the number of instances that such one or more three graph node topologies appear in the graph where one graph node is in between two other graph nodes that are disjoint.

Figure 6:
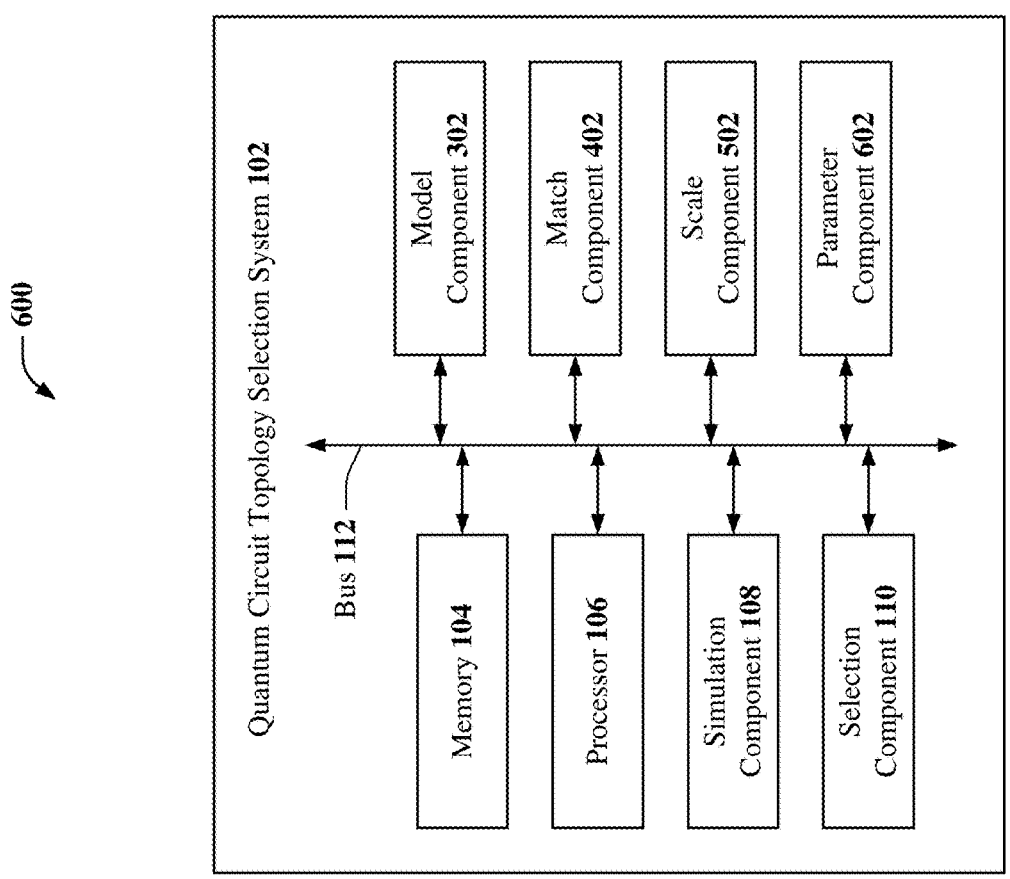
FIG. 6 illustrates a block diagram of an example, non-limiting system that can facilitate quantum circuit topology selection based on frequency collisions between qubits in accordance with one or more embodiments described herein.

FIG. 6 illustrates a block diagram of an example, non-limiting system 600 that can facilitate quantum circuit topology selection based on frequency collisions between qubits in accordance with one or more embodiments described herein. In some embodiments, system 600 can comprise a quantum circuit topology selection system 102. In some embodiments, quantum circuit topology selection system 102 can further comprise a parameter component 602. Repetitive description of like elements and/or processes employed in respective embodiments is omitted for sake of brevity.

According to multiple embodiments, parameter component 602 can determine one or more parameters corresponding to at least one of qubits, a topology of a quantum circuit, or a quantum circuit that provide a defined yield. For example, parameter component 602 can determine one or more parameters corresponding to one or more qubits (e.g., one or more qubits modeled as graph nodes 204), one or more topologies of quantum circuits (e.g., one or more topologies modeled as graph 202, subgraph topologies 208, 210, 212, graphs 702a, 702b, 702c, etc.), and/or one or more quantum circuits (e.g., a quantum circuit modeled as graph 202, subgraph topologies 208, 210, 212, graphs 702a, 702b, 702c, etc.) that provide a defined yield (e.g., a desired yield, a desired performance result, etc.).

In some embodiments, such a defined yield (e.g., desired yield, desired performance results, etc.) described above can be defined by an entity (e.g., a human using a GUI of quantum circuit topology selection system 102). In some embodiments, such a defined yield can include, but is not limited to: a defined performance (e.g., best performance); a defined number of frequency collisions (e.g., fewest quantity of frequency collisions); a defined number of gate errors (e.g., fewest quantity of gate errors); defined quantum decoherence times (e.g., longest quantum decoherence times); defined computation accuracy (e.g., most accurate computation results); defined computation time (e.g., fastest computation times); defined computational cost (e.g., lowest computational cost); and/or another defined yield that can be facilitated (e.g., enabled, caused, etc.) by such component(s) described above based on one or more parameters that can be defined by parameter component 602.

In some embodiments, parameter component 602 can determine one or more parameters corresponding to such one or more qubits, such one or more topologies of quantum circuits, and/or such quantum circuits, where such parameter(s) can include but are not limited to quantum circuit architecture and/or topology parameters (e.g., quantity of qubits, location of qubits, qubit coupling parameters, etc.), frequency of components (e.g., qubit frequency, transmission line frequency, resonator frequency, etc.), component material (e.g., semiconducting and/or superconducting materials of quantum circuit such as, for instance, substrate material, materials of each qubit, transmission line material, resonator material, etc.), component dimensions (e.g., dimensions of quantum circuit and/or components thereof such as, dimensions of materials of each qubit, dimensions of transmission lines, dimensions of resonators, etc.), and/or another parameter.

In some embodiments, parameter component 602 can determine such one or more parameters described above by defining one or more values of such parameter(s) and/or employing simulation component 108 to simulate operation of such one or more qubit(s), topologies of quantum circuits, and/or quantum circuits to observe results generated by such components based on such value(s) of such parameter(s). In some embodiments, parameter component 602 can determine such one or more parameters described above by defining the same value(s) or different value(s) to such parameter(s) of one or more of the components described above (e.g., one or more qubit(s), topologies of quantum circuits, quantum circuits, etc.) and/or employing simulation component 108 to observe results generated by such components based on such value(s) of such parameter(s). For example, parameter component 602 can define a single mean frequency value with random scatter about it for all qubits of a quantum circuit that can be simulated by simulation component 108. In some embodiments, parameter component 602 and/or simulation component 108 can repeat such parameter value definition and/or simulation process described above as many times as necessary to determine one or more parameters and/or one or more parameter values that enable such components simulated by simulation component 108 to produce a defined yield (e.g., a desired yield, a desired performance result, etc.).

In some embodiments, parameter component 602 can define one or more parameters and/or one or more parameter values of multiple candidate quantum circuit topologies (e.g., graph 202, subgraph topologies 208, 210, 212, various subgraph topologies of graphs 702a, 702b, 702c, etc.) to determine which of such multiple candidate quantum circuit topologies can facilitate such a defined yield described above. For example, parameter component 602 can define one or more parameters and/or one or more parameter values of multiple candidate quantum circuit topologies (e.g., graph 202, subgraph topologies 208, 210, 212, various subgraph topologies of graphs 702a, 702b, 702c, etc.) to determine which of such multiple candidate quantum circuit topologies can facilitate the fewest quantity of frequency collisions between qubits of such multiple candidate quantum circuit topologies.

Figure 7A:
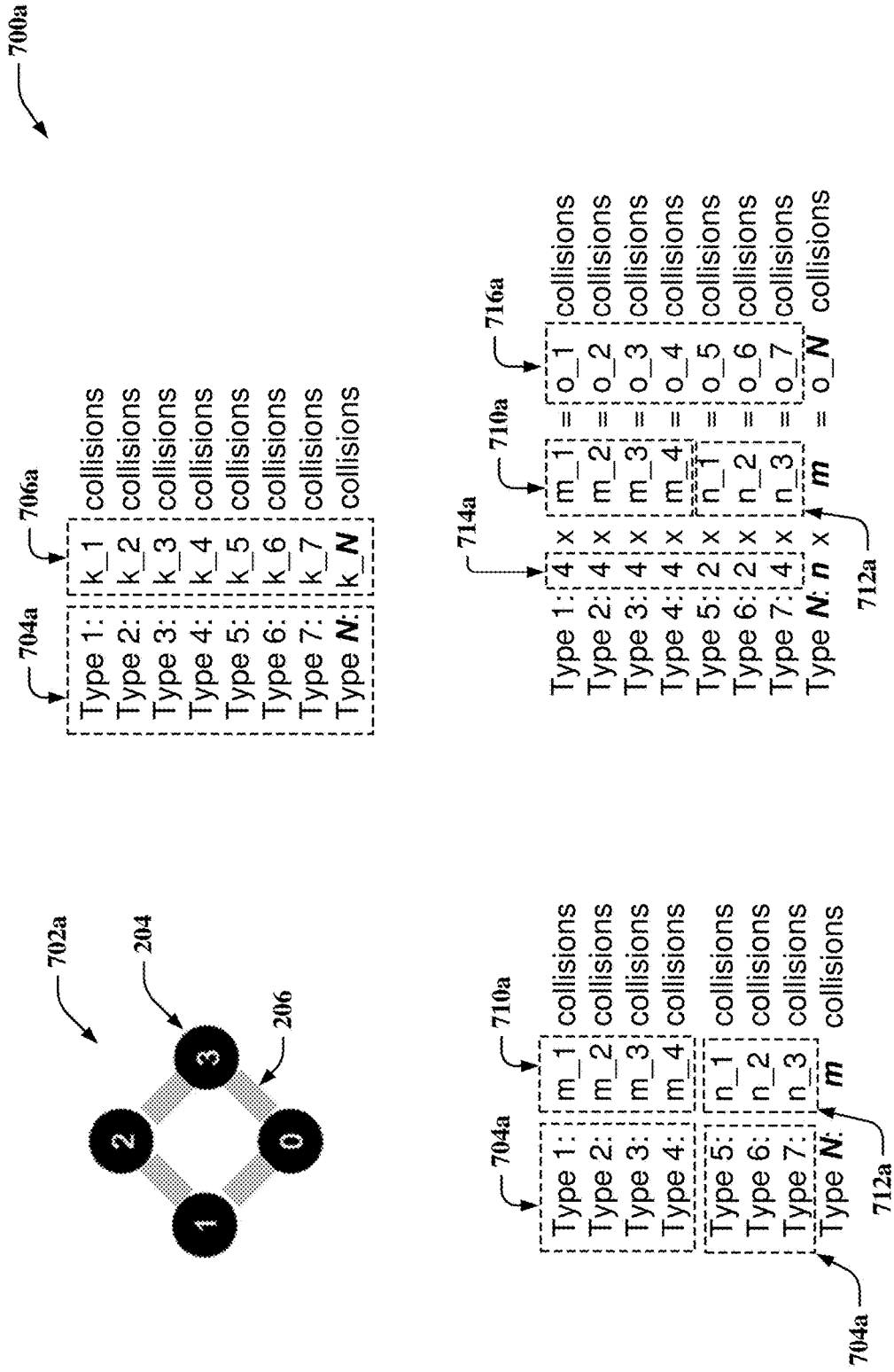
FIGS. 7A, 7B, 7C illustrate example, non-limiting information that can facilitate quantum circuit topology selection based on frequency collisions between qubits in accordance with one or more embodiments described herein.
Figure 7B:
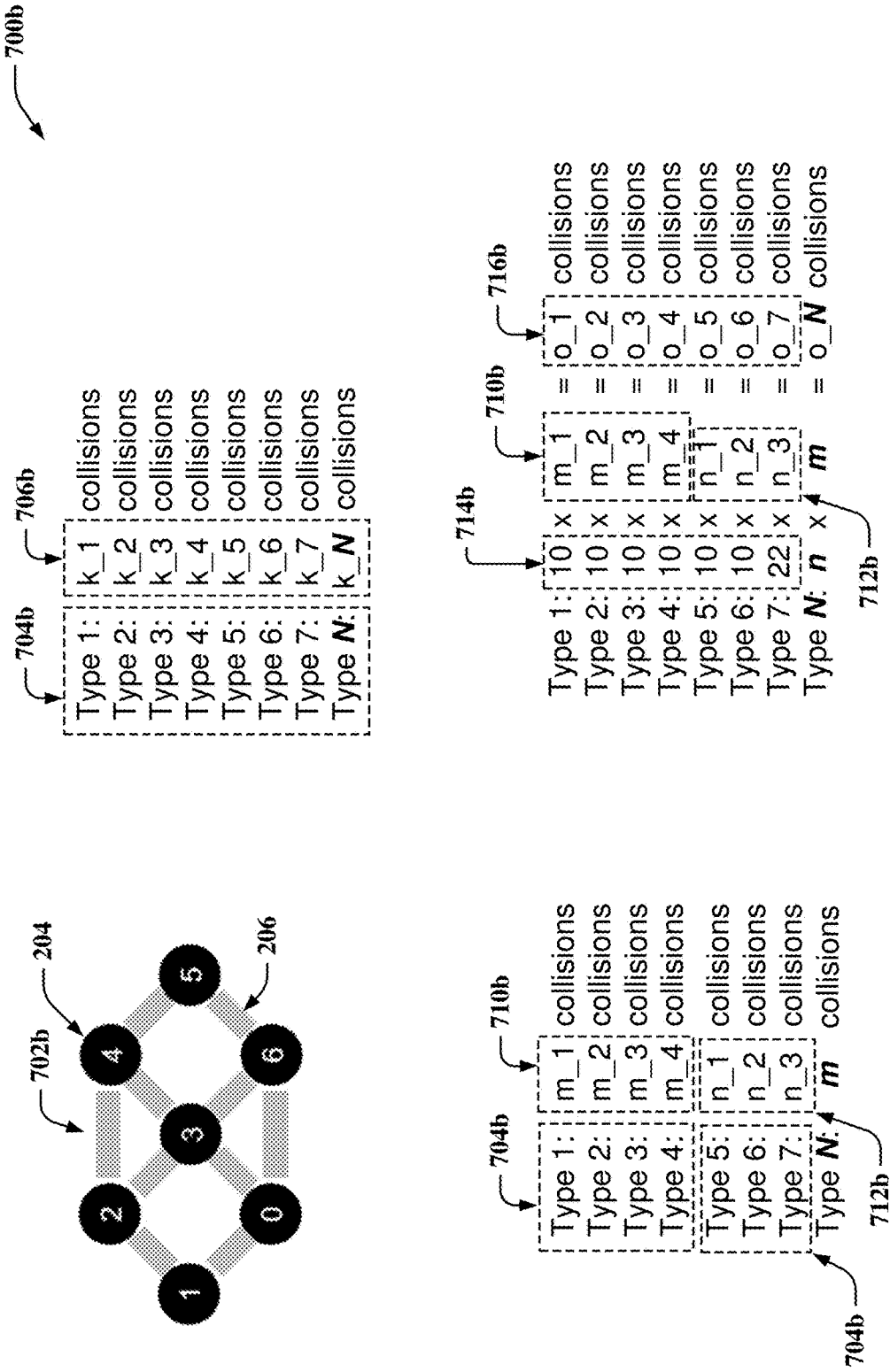
Figure 7C:
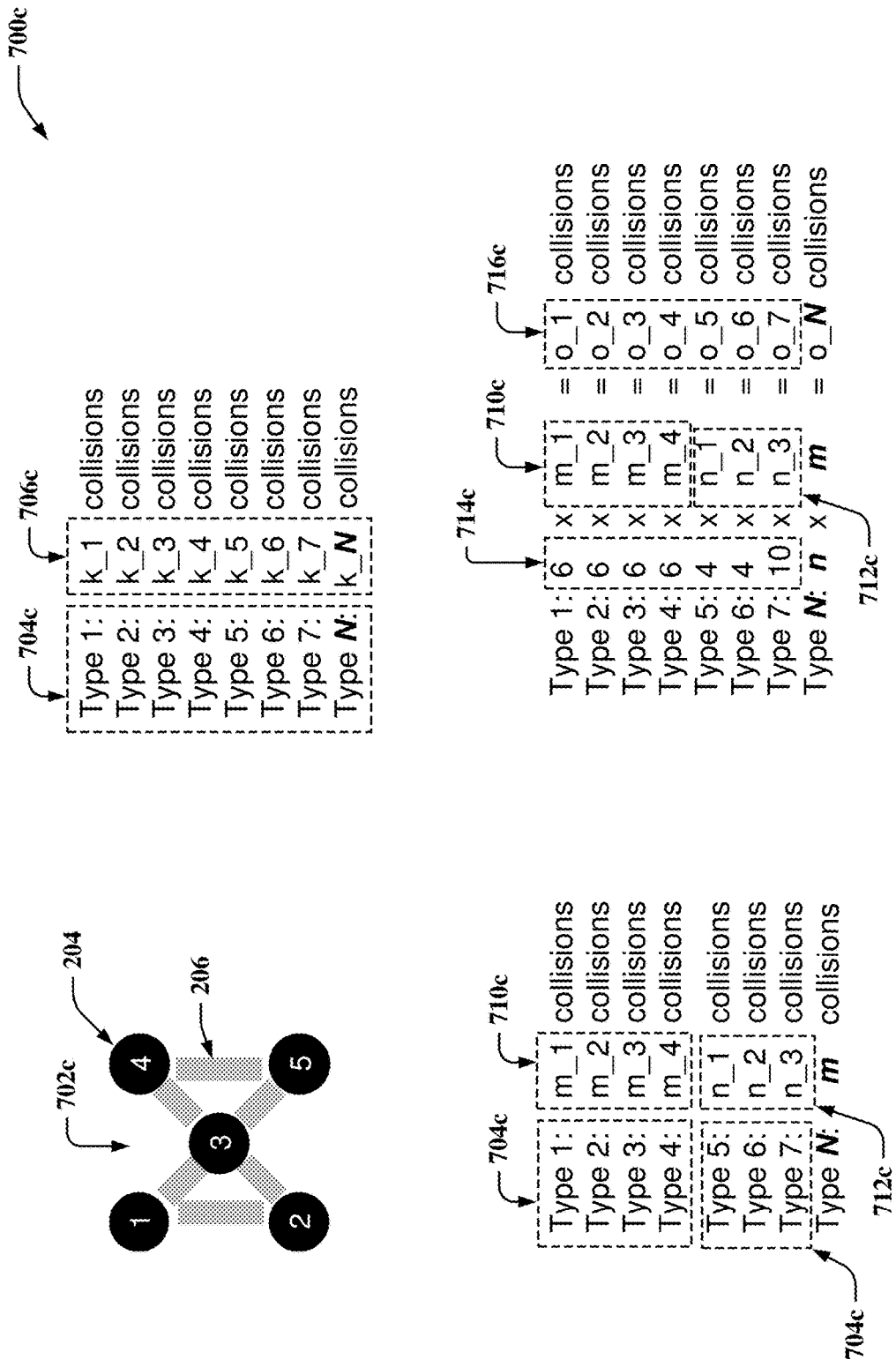

FIGS. 7A, 7B, 7C illustrate example, non-limiting information 700a, 700b, 700c that can facilitate quantum circuit topology selection based on frequency collisions between qubits in accordance with one or more embodiments described herein. Repetitive description of like elements and/or processes employed in respective embodiments is omitted for sake of brevity.

According to multiple embodiments, information 700a (FIG. 7A) can comprise a graph 702a. In some embodiments, graph 702a can comprise an example, non-limiting alternative embodiment of graph 202, where graph 702a can comprise one or more graph nodes 204 (denoted as numerical values 0, 1, 2, and 3 as depicted in FIG. 7A) and/or one or more graph edges 206.

In some embodiments, simulation component 108 can simulate operation of graph 702a to determine one or more types of frequency collisions and/or one or more quantities of frequency collisions corresponding to such one or more types of frequency collisions. For example, simulation component 108 can simulate operation of graph 702a (e.g., via Monte Carlo simulation) to determine one or more types of frequency collisions 704a (denoted as Type 1, 2, 3, 4, 5, 6, 7, and N in FIG. 7A, where N denotes a quantity of different types of frequency collisions) and/or one or more quantities of frequency collisions 706a (denoted as k_1, k_2, k_3, k_4, k_5, k_6, k_7, and k_N in FIG. 7A, where k_N denotes a quantity of frequency collisions of Type N) corresponding to such one or more types of frequency collisions.

Additionally, or alternatively, in some embodiments, simulation component 108 can simulate operation of one or more subgraph topologies of graph 702a to determine one or more types of frequency collisions and/or one or more quantities of frequency collisions corresponding to such one or more types of frequency collisions. For example, simulation component 108 can simulate operation of one or more different types of subgraph topologies including, but not limited to, one or more two graph node topologies, one or more three graph node topologies, and/or another type of subgraph topology to determine one or more types of frequency collisions 704a and/or one or more quantities of frequency collisions 710a, 712a (denoted as m_1, m_2, m_3, m_4 and n_1, n_2, n_3, respectively, in FIG. 7A) corresponding to such one or more types of frequency collisions 704a, where m denoted in FIG. 7A represents a quantity of frequency collisions of Type N. In some embodiments, such different types of subgraph topologies can comprise one or more various configurations of graph nodes 204. For example, simulation component 108 can simulate one or more two graph node topologies of graph 702a, where such two graph node topologies can include, but are not limited to: graph nodes 1 and 2; graph nodes 2 and 3; graph nodes 3 and 0; graph nodes 0 and 1; and/or another two graph node topology of graph 702a. In another example, simulation component 108 can simulate one or more three graph node topologies of graph 702a, where such three graph node topologies can include, but are not limited to: graph nodes 1, 2, and 3; graph nodes 2, 3, and 0; graph nodes 3, 0, and 1; graph nodes 0, 1, and 2; and/or another three graph node topology of graph 702a.

In some embodiments, simulation component 108 can simulate one or more of such two graph node topologies defined above to determine one or more types of frequency collisions 704a (e.g., Types 1, 2, 3, and 4 as illustrated in FIG. 7A) that correspond to such two graph node topologies and/or quantities of frequency collisions 710a (denoted as m_1, m_2, m_3, and m_4 in FIG. 7A) of such types of frequency collisions 704a. In some embodiments, simulation component 108 can simulate one or more of such three graph node topologies defined above to determine one or more types of frequency collisions 704a (e.g., Types 5, 6, and 7 as illustrated in FIG. 7A) that correspond to such three graph node topologies and/or quantities of frequency collisions 712a (denoted as n_1, n_2, and n_3 in FIG. 7A) of such types of frequency collisions 704a.

In some embodiments, scale component 502 can determine a quantity of instances 714a (n denotes a quantity of instances of a certain type of subgraph topology corresponding to Type N frequency collisions) a two graph node topology and/or a three graph node topology appears in graph 702a. For example, scale component 502 can determine that there are four different two graph node topologies in graph 702a that correspond to frequency collision types 1, 2, 3, and 4 as illustrated in FIG. 7A. In another example, scale component 502 can determine that there are two different three graph node topologies in graph 702a that correspond to frequency collision types 5 and 6 as illustrated in FIG. 7A, where such three graph node topologies have at least two qubits that are not neighbors. In another example, scale component 502 can determine that there are four different three graph node topologies in graph 702a that correspond to frequency collision type 7 as illustrated in FIG. 7A.

In some embodiments, scale component 502 can scale quantities of frequency collisions 710a, 712a for each type of frequency collisions 704a that correspond to each subgraph topology simulated by simulation component 108 as described above to determine a total quantity of frequency collisions 716a (denoted as o_1, o_2, o_3, o_4, o_5, o_6, o_7, and o_N in FIG. 7A, where o_N denotes a quantity of frequency collisions of Type N) of graph 702a. For example, to facilitate such scaling, as illustrated in FIG. 7A, scale component 502 can multiply quantity of instances 714a by quantities of frequency collisions 710a, 712a to calculate total quantity of frequency collisions 716a.

In some embodiments, as illustrated in FIG. 7A, total quantity of frequency collisions 716a that can be calculated in accordance with one or more embodiments of the subject disclosure described herein (e.g., via simulation component 108, selection component 110, model component 302, match component 402, scale component 502, and/or parameter component 602) can comprise values that are approximately the same as quantity of frequency collisions 706a that can be calculated using existing simulation techniques such as, for instance, Monte Carlo simulation to simulate the entire graph 702a at one time (e.g., via simulation component 108 only). For example, total quantity of frequency collisions 716a that can be calculated in accordance with one or more embodiments of the subject disclosure described herein can comprise values such as, for instance: $k\_1 \sim o\_1$; $k\_2 \sim o\_2$; $k\_3 \sim o\_3$; $k\_4 \sim o\_4$; $k\_5 \sim o\_5$; $k\_6 \sim o\_6$; $k\_7 \sim o\_7$; and/or $k\_N \sim o\_N$. In another example, total quantity of frequency collisions 716a that can be calculated in accordance with one or more embodiments of the subject disclosure described herein can comprise values such as, for instance: $k\_1 = o\_1 + e\_1$; $k\_2 = o\_2 + e\_2$; $k\_3 = o\_3 + e\_3$; $k\_4 = o\_4 + e\_4$; $k\_5 = o\_5 + e\_5$; $k\_6 = o\_6 + e\_6$; $k\_7 = o\_7 + e\_7$; and/or $k\_N = o\_N + e\_N$, where $e\_1$, $e\_2$, $e\_3$, $e\_4$, $e\_5$, $e\_6$, $e\_7$, and/or $e\_N$ denote error parameters.

According to multiple embodiments, information 700b (FIG. 7B) can comprise a graph 702b. In some embodiments, graph 702b can comprise an example, non-limiting alternative embodiment of graph 202 and/or graph 702a, where graph 702b can comprise one or more graph nodes 204 (denoted as numerical values 0, 1, 2, 3 4, 5, and 6 as depicted in FIG. 7B) and/or one or more graph edges 206.

In some embodiments, simulation component 108 can simulate operation of graph 702b to determine one or more types of frequency collisions and/or one or more quantities of frequency collisions corresponding to such one or more types of frequency collisions. For example, simulation component 108 can simulate operation of graph 702b (e.g., via Monte Carlo simulation) to determine one or more types of frequency collisions 704b (denoted as Type 1, 2, 3, 4, 5, 6, 7, and N in FIG. 7B, where N denotes a quantity of different types of frequency collisions) and/or one or more quantities of frequency collisions 706b (denoted as k_1, k_2, k_3, k_4, k_5, k_6, k_7, and k_N in FIG. 7B, where k_N denotes a quantity of frequency collisions of Type N) corresponding to such one or more types of frequency collisions.

Additionally, or alternatively, in some embodiments, simulation component 108 can simulate operation of one or more subgraph topologies of graph 702b to determine one or more types of frequency collisions and/or one or more quantities of frequency collisions corresponding to such one or more types of frequency collisions. For example, simulation component 108 can simulate operation of one or more different types of subgraph topologies including, but not limited to, one or more two graph node topologies, one or more three graph node topologies, and/or another type of subgraph topology to determine one or more types of frequency collisions 704b and/or one or more quantities of frequency collisions 710b, 712b (denoted as m_1, m_2, m_3, m_4 and n_1, n_2, n_3, respectively, in FIG. 7B) corresponding to such one or more types of frequency collisions 704b, where m denoted in FIG. 7B represents a quantity of frequency collisions of Type N. In some embodiments, such different types of subgraph topologies can comprise one or more various configurations of graph nodes 204. For example, simulation component 108 can simulate one or more two graph node topologies of graph 702b, where such two graph node topologies can include, but are not limited to: graph nodes 1 and 2; graph nodes 2 and 3; graph nodes 3 and 0; graph nodes 0 and 1; graph nodes 2 and 4; graph nodes 0 and 6; graph nodes 3 and 4; graph nodes 4 and 5; graph nodes 5 and 6; graph nodes 6 and 3; and/or another two graph node topology of graph 702b. In another example, simulation component 108 can simulate one or more three graph node topologies of graph 702b, where such three graph node topologies can include, but are not limited to: graph nodes 1, 2, and 3; graph nodes 2, 3, and 0; graph nodes 3, 0, and 1; graph nodes 0, 1, and 2; and/or other three graph node topologies of graph 702b.

In some embodiments, simulation component 108 can simulate one or more of such two graph node topologies defined above to determine one or more types of frequency collisions 704b (e.g., Types 1, 2, 3, and 4 as illustrated in FIG. 7B) that correspond to such two graph node topologies and/or quantities of frequency collisions 710b (denoted as m_1, m_2, m_3, and m_4 in FIG. 7B) of such types of frequency collisions 704b. In some embodiments, simulation component 108 can simulate one or more of such three graph node topologies defined above to determine one or more types of frequency collisions 704b (e.g., Types 5, 6, and 7 as illustrated in FIG. 7B) that correspond to such three graph node topologies and/or quantities of frequency collisions 712b (denoted as n_1, n_2, and n_3 in FIG. 7B) of such types of frequency collisions 704b.

In some embodiments, scale component 502 can determine a quantity of instances 714b (n denotes a quantity of instances of a certain type of subgraph topology corresponding to Type N frequency collisions) a two graph node topology and/or a three graph node topology appears in graph 702b. For example, scale component 502 can determine that there are ten different two graph node topologies in graph 702b that correspond to frequency collision types 1, 2, 3, and 4 as illustrated in FIG. 7B. In another example, scale component 502 can determine that there are ten different three graph node topologies in graph 702b that correspond to frequency collision types 5 and 6 as illustrated in FIG. 7B, where such three graph node topologies have at least two qubits that are not neighbors. In another example, scale component 502 can determine that there are twenty-two different three graph node topologies in graph 702b that correspond to frequency collision type 7 as illustrated in FIG. 7B.

In some embodiments, scale component 502 can scale quantities of frequency collisions 710b, 712b for each type of frequency collisions 704b that correspond to each subgraph topology simulated by simulation component 108 as described above to determine a total quantity of frequency collisions 716b (denoted as o_1, o_2, o_3, o_4, o_5, o_6, o_7, and o_N in FIG. 7B, where o_N denotes a quantity of frequency collisions of Type N) of graph 702b. For example, to facilitate such scaling, as illustrated in FIG. 7B, scale component 502 can multiply quantity of instances 714b by quantities of frequency collisions 710b, 712b to calculate total quantity of frequency collisions 716b.

In some embodiments, as illustrated in FIG. 7B, total quantity of frequency collisions 716b that can be calculated in accordance with one or more embodiments of the subject disclosure described herein (e.g., via simulation component 108, selection component 110, model component 302, match component 402, scale component 502, and/or parameter component 602) can comprise values that are approximately the same as quantity of frequency collisions 706b that can be calculated using existing simulation techniques such as, for instance, Monte Carlo simulation to simulate the entire graph 702b at one time (e.g., via simulation component 108 only). For example, total quantity of frequency collisions 716b that can be calculated in accordance with one or more embodiments of the subject disclosure described herein can comprise values such as, for instance: k_1~o_1; k_2~o_2; k_3~o_3; k_4~o_4; k_5~o_5; k_6~o_6; k_7~o_7; and/or k_N~o_N. In another example, total quantity of frequency collisions 716b that can be calculated in accordance with one or more embodiments of the subject disclosure described herein can comprise values such as, for instance: k_1=o_1+e_1; k_2=o_2+e_2; k_3=o_3+e_3; k_4=o_4+e_4; k_5=o_5+e_5; k_6=o_6+e_6; k_7=o_7+e_7; and/or k_N=o_N+e_N, where e_1, e_2, e_3, e_4, e_5, e_6, e_7, and/or e_N denote error parameters.

According to multiple embodiments, information 700c (FIG. 7C) can comprise a graph 702c. In some embodiments, graph 702c can comprise an example, non-limiting alternative embodiment of graph 202, graph 702a, and/or graph 702b, where graph 702c can comprise one or more graph nodes 204 (denoted as numerical values 1, 2, 3 4, and 5 as depicted in FIG. 7C) and/or one or more graph edges 206.

In some embodiments, simulation component 108 can simulate operation of graph 702c to determine one or more types of frequency collisions and/or one or more quantities of frequency collisions corresponding to such one or more types of frequency collisions. For example, simulation component 108 can simulate operation of graph 702c (e.g., via Monte Carlo simulation) to determine one or more types of frequency collisions 704c (denoted as Type 1, 2, 3, 4, 5, 6, 7, and N in FIG. 7C, where N denotes a quantity of different types of frequency collisions) and/or one or more quantities of frequency collisions 706c (denoted as k_1, k_2, k_3, k_4, k_5, k_6, k_7, and k_N in FIG. 7C, where k_N denotes a quantity of frequency collisions of Type N) corresponding to such one or more types of frequency collisions.

Additionally, or alternatively, in some embodiments, simulation component 108 can simulate operation of one or more subgraph topologies of graph 702c to determine one or more types of frequency collisions and/or one or more quantities of frequency collisions corresponding to such one or more types of frequency collisions. For example, simulation component 108 can simulate operation of one or more different types of subgraph topologies including, but not limited to, one or more two graph node topologies, one or more three graph node topologies, and/or another type of subgraph topology to determine one or more types of frequency collisions 704c and/or one or more quantities of frequency collisions 710c, 712c (denoted as m_1, m_2, m_3, m_4 and n_1, n_2, n_3, respectively, in FIG. 7C) corresponding to such one or more types of frequency collisions 704c, where m denoted in FIG. 7C represents a quantity of frequency collisions of Type N. In some embodiments, such different types of subgraph topologies can comprise one or more various configurations of graph nodes 204. For example, simulation component 108 can simulate one or more two graph node topologies of graph 702c, where such two graph node topologies can include, but are not limited to: graph nodes 1 and 2; graph nodes 2 and 3; graph nodes 3 and 1; graph nodes 3 and 4; graph nodes 4 and 5; graph nodes 5 and 3; and/or another two graph node topology of graph 702c. In another example, simulation component 108 can simulate one or more three graph node topologies of graph 702c, where such three graph node topologies can include, but are not limited to: graph nodes 1, 2, and 3; graph nodes 3, 4, and 5; and/or other three graph node topologies of graph 702c.

In some embodiments, simulation component 108 can simulate one or more of such two graph node topologies defined above to determine one or more types of frequency collisions 704c (e.g., Types 1, 2, 3, and 4 as illustrated in FIG. 7C) that correspond to such two graph node topologies and/or quantities of frequency collisions 710c (denoted as m_1, m_2, m_3, and m_4 in FIG. 7C) of such types of frequency collisions 704c. In some embodiments, simulation component 108 can simulate one or more of such three graph node topologies defined above to determine one or more types of frequency collisions 704c (e.g., Types 5, 6, and 7 as illustrated in FIG. 7C) that correspond to such three graph node topologies and/or quantities of frequency collisions 712c (denoted as n_1, n_2, and n_3 in FIG. 7C) of such types of frequency collisions 704c.

In some embodiments, scale component 502 can determine a quantity of instances 714c (n denotes a quantity of instances of a certain type of subgraph topology corresponding to Type N frequency collisions) a two graph node topology and/or a three graph node topology appears in graph 702c. For example, scale component 502 can determine that there are six different two graph node topologies in graph 702c that correspond to frequency collision types 1, 2, 3, and 4 as illustrated in FIG. 7C. In another example, scale component 502 can determine that there are four different three graph node topologies in graph 702c that correspond to frequency collision types 5 and 6 as illustrated in FIG. 7C, where such three graph node topologies have at least two qubits that are not neighbors. In another example, scale component 502 can determine that there are ten different three graph node topologies in graph 702c that correspond to frequency collision type 7 as illustrated in FIG. 7C.

In some embodiments, scale component 502 can scale quantities of frequency collisions 710c, 712c for each type of frequency collisions 704c that correspond to each subgraph topology simulated by simulation component 108 as described above to determine a total quantity of frequency collisions 716c (denoted as o_1, o_2, o_3, o_4, o_5, o_6, o_7, and o_N in FIG. 7C, where o_N denotes a quantity of frequency collisions of Type N) of graph 702c. For example, to facilitate such scaling, as illustrated in FIG. 7C, scale component 502 can multiply quantity of instances 714c by quantities of frequency collisions 710c, 712c to calculate total quantity of frequency collisions 716c.

In some embodiments, as illustrated in FIG. 7C, total quantity of frequency collisions 716c that can be calculated in accordance with one or more embodiments of the subject disclosure described herein (e.g., via simulation component 108, selection component 110, model component 302, match component 402, scale component 502, and/or parameter component 602) can comprise values that are approximately the same as quantity of frequency collisions 706c that can be calculated using existing simulation techniques such as, for instance, Monte Carlo simulation to simulate the entire graph 702c at one time (e.g., via simulation component 108 only). For example, total quantity of frequency collisions 716c that can be calculated in accordance with one or more embodiments of the subject disclosure described herein can comprise values such as, for instance: k_1~o_1; k_2~o_2; k_3~o_3; k_4~o_4; k_5~o_5; k_6~o_6; k_7~o_7; and/or k_N~o_N. In another example, total quantity of frequency collisions 716c that can be calculated in accordance with one or more embodiments of the subject disclosure described herein can comprise values such as, for instance: k_1=o_1+e_1; k_2=o_2+e_2; k_3=o_3+e_3; k_4=o_4+e_4; k_5=o_5+e_5; k_6=o_6+e_6; k_7=o_7+e_7; and/or k_N=o_N=e_N, where e_1, e_2, e_3, e_4, e_5, e_6, e_7, and/or e_N denote error parameters.

In some embodiments, quantum circuit topology selection system 102 can be associated with various technologies. For example, quantum circuit topology selection system 102 can be associated with classical computing technologies, quantum computing technologies, superconducting circuit technologies, superconducting circuit simulation technologies, qubit technologies, qubit frequency collision technologies, and/or other technologies.

In some embodiments, quantum circuit topology selection system 102 can provide technical improvements to systems, devices, components, operational steps, and/or processing steps associated with the various technologies identified above. For example, quantum circuit topology selection system 102 can simulate operation of qubits in a subgraph topology of a graph representing a topology of a quantum circuit to determine a quantity of frequency collisions between the qubits. In this example, by simulating operation of qubits in such a subgraph topology of such a graph as opposed to simulating operation of all qubits in the graph at one time, quantum circuit topology selection system 102 can facilitate reduced simulation time, improved simulation efficiency, improved simulation accuracy, and/or improved simulation performance of a quantum circuit simulator (e.g., simulation component 108) associated with quantum circuit topology selection system 102.

In some embodiments, quantum circuit topology selection system 102 can provide technical improvements to a processing unit (e.g., processor 106) associated with a classical computing device and/or a quantum computing device (e.g., a quantum processor, quantum hardware, superconducting circuit, etc.). For example, by simulating operation of qubits in a subgraph topology of a graph representing a topology of a quantum circuit as opposed to simulating operation of all qubits in the graph at one time, quantum circuit topology selection system 102 can thereby reduce the time and effort (e.g., human effort, computational effort and/or cost, etc.) needed to design and/or simulate one or more candidate quantum circuit topologies (e.g., superconducting circuit topologies) with proper accuracy. In this example, by simulating operation of qubits in such a subgraph topology of such a graph, quantum circuit topology selection system 102 can facilitate improved performance and/or reduced computation costs of a processing unit (e.g., processor 106) associated with quantum circuit topology selection system 102 by reducing processing time and/or processing workload of such a processing unit.

In some embodiments, quantum circuit topology selection system 102 can employ hardware or software to solve problems that are highly technical in nature, that are not abstract and that cannot be performed as a set of mental acts by a human. In some embodiments, some of the processes described herein may be performed by one or more specialized computers (e.g., one or more specialized processing units, a specialized quantum computer, etc.) for carrying out defined tasks related to the various technologies identified above. In some embodiments, quantum circuit topology selection system 102 and/or components thereof, can be employed to solve new problems that arise through advancements in technologies mentioned above, employment of quantum computing systems, cloud computing systems, computer architecture, and/or another technology.

It is to be appreciated that quantum circuit topology selection system 102 can utilize various combinations of electrical components, mechanical components, and circuitry that cannot be replicated in the mind of a human or performed by a human, as the various operations that can be executed by quantum circuit topology selection system 102 and/or components thereof as described herein are operations that are greater than the capability of a human mind. For instance, the amount of data processed, the speed of processing such data, or the types of data processed by quantum circuit topology selection system 102 over a certain period of time can be greater, faster, or different than the amount, speed, or data type that can be processed by a human mind over the same period of time.

According to several embodiments, quantum circuit topology selection system 102 can also be fully operational towards performing one or more other functions (e.g., fully powered on, fully executed, etc.) while also performing the various operations described herein. It should be appreciated that such simultaneous multi-operational execution is beyond the capability of a human mind. It should also be appreciated that quantum circuit topology selection system 102 can include information that is impossible to obtain manually by an entity, such as a human user. For example, the type, amount, or variety of information included in quantum circuit topology selection system 102, simulation component 108, selection component 110, model component 302, match component 402, scale component 502, and/or parameter component 602 can be more complex than information obtained manually by a human user.

Figure 8:
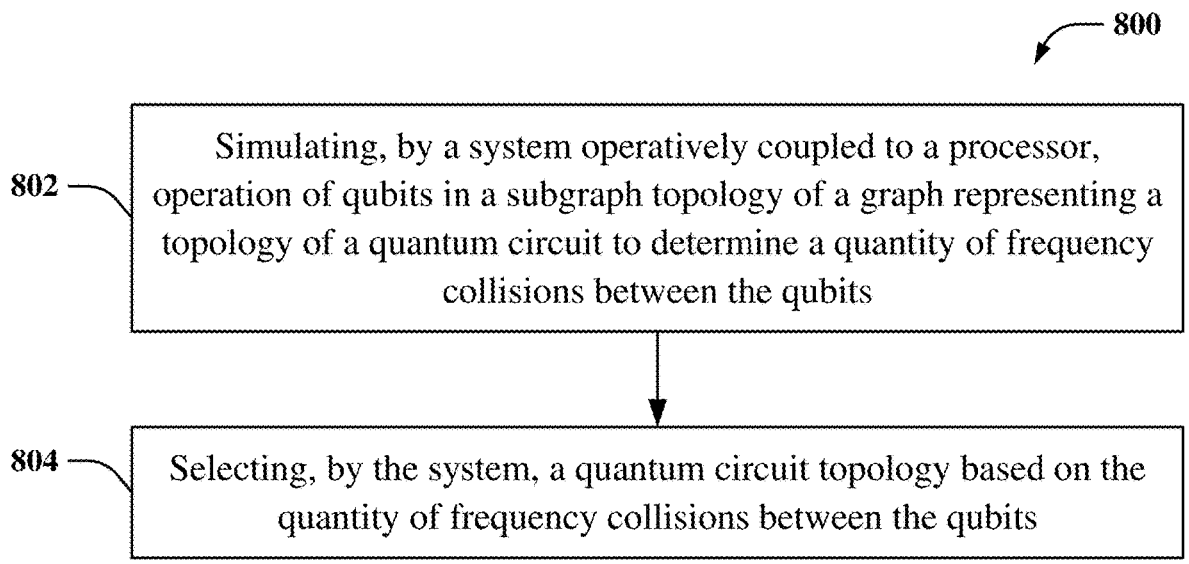
FIG. 8 illustrates a flow diagram of an example, non-limiting computer-implemented method that can facilitate quantum circuit topology selection based on frequency collisions between qubits in accordance with one or more embodiments described herein.

FIG. 8 illustrates a flow diagram of an example, non-limiting computer-implemented method 800 that can facilitate quantum circuit topology selection based on frequency collisions between qubits in accordance with one or more embodiments described herein. Repetitive description of like elements and/or processes employed in respective embodiments is omitted for sake of brevity.

In some embodiments, at 802, computer-implemented method 800 can comprise simulating, by a system (e.g., via quantum circuit topology selection system 102 and/or simulation component 108) operatively coupled to a processor (e.g., processor 106), operation of qubits in a subgraph topology (e.g., subgraph topologies 208, 210, 212, various subgraph topologies of graphs 702a, 702b, 702c, etc.) of a graph (e.g., graph 202, graphs 702a, 702b, 702c, etc.) representing a topology of a quantum circuit to determine a quantity of frequency collisions (e.g., quantities of frequency collisions 710a, 710b, 710c, 712a, 712b, 712c, etc.) between the qubits.

In some embodiments, at 804, computer-implemented method 800 can comprise selecting, by the system (e.g., via quantum circuit topology selection system 102 and/or selection component 110), a quantum circuit topology based on the quantity of frequency collisions between the qubits.

Figure 9:
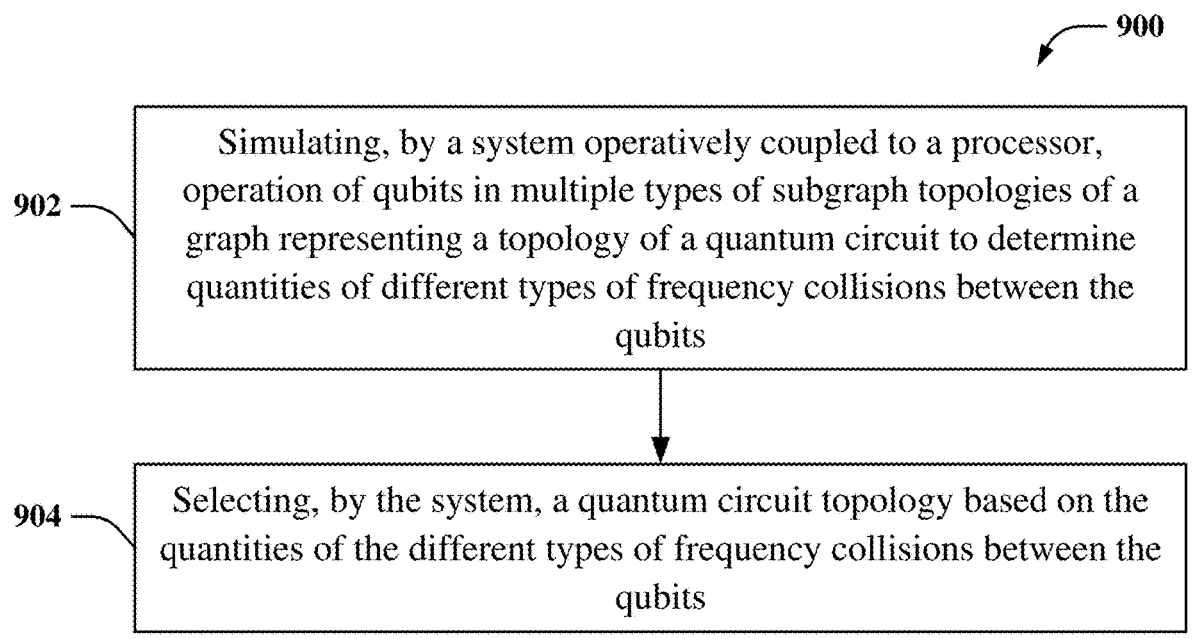
FIG. 9 illustrates a flow diagram of an example, non-limiting computer-implemented method that can facilitate quantum circuit topology selection based on frequency collisions between qubits in accordance with one or more embodiments described herein.

FIG. 9 illustrates a flow diagram of an example, non-limiting computer-implemented method 900 that can facilitate quantum circuit topology selection based on frequency collisions between qubits in accordance with one or more embodiments described herein. Repetitive description of like elements and/or processes employed in respective embodiments is omitted for sake of brevity.

In some embodiments, at 902, computer-implemented method 900 can comprise simulating, by a system (e.g., via quantum circuit topology selection system 102 and/or simulation component 108) operatively coupled to a processor (e.g., processor 106), operation of qubits in multiple types of subgraph topologies (e.g., subgraph topologies 208, 210, 212, various subgraph topologies of graphs 702a, 702b, 702c, etc.) of a graph (e.g., graph 202, graphs 702a, 702b, 702c, etc.) representing a topology of a quantum circuit to determine quantities of different types of frequency collisions (e.g., quantities of frequency collisions 710a, 710b, 710c, 712a, 712b, 712c, etc.) between the qubits.

In some embodiments, at 904, computer-implemented method 900 can comprise selecting, by the system (e.g., via quantum circuit topology selection system 102 and/or selection component 110), a quantum circuit topology based on the quantities of the different types of frequency collisions between the qubits.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 10:
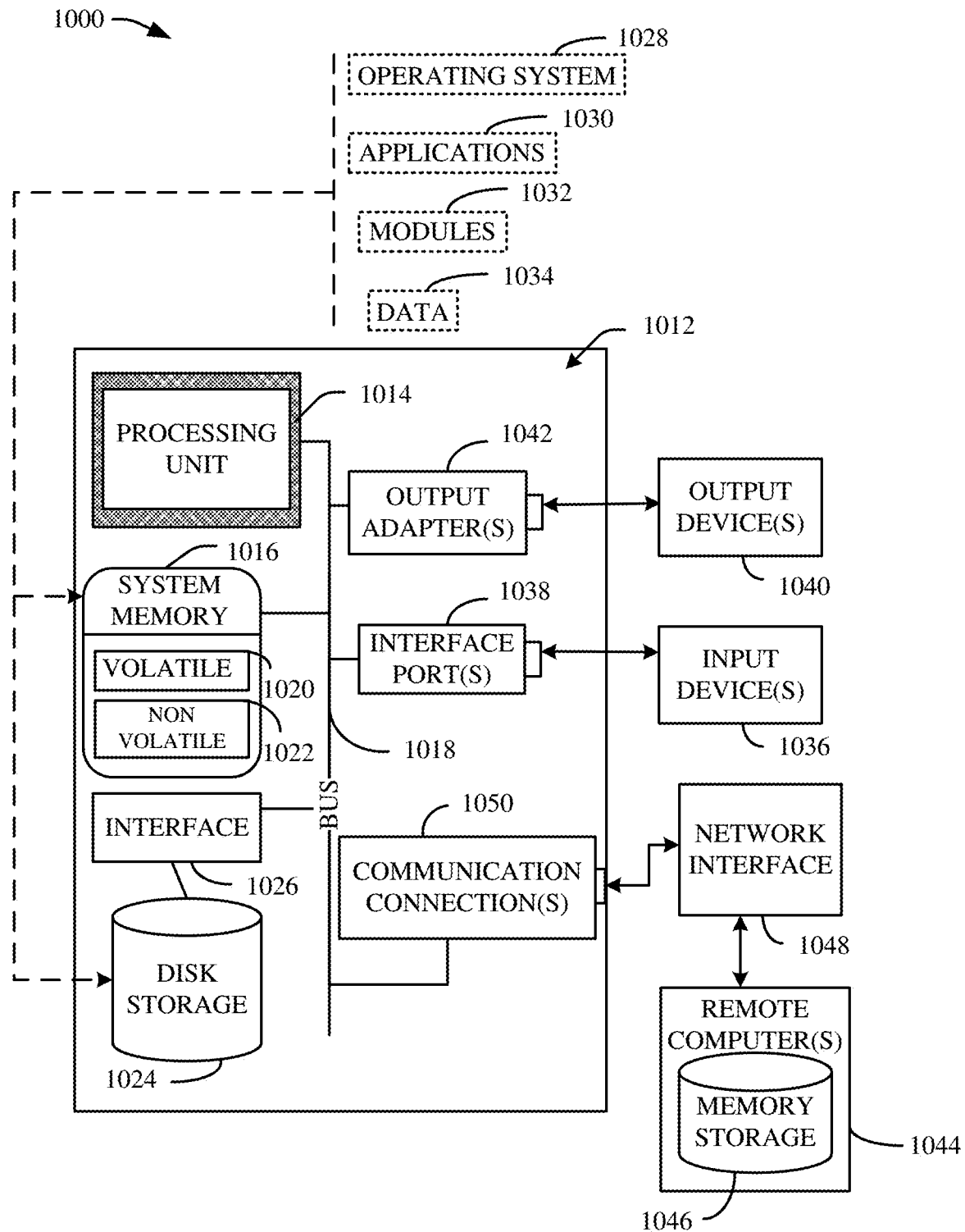
FIG. 10 illustrates a block diagram of an example, non-limiting operating environment in which one or more embodiments described herein can be facilitated.

In order to provide a context for the various aspects of the disclosed subject matter, FIG. 10 as well as the following discussion are intended to provide a general description of a suitable environment in which the various aspects of the disclosed subject matter can be implemented. FIG. 10 illustrates a block diagram of an example, non-limiting operating environment in which one or more embodiments described herein can be facilitated. Repetitive description of like elements employed in other embodiments described herein is omitted for sake of brevity.

With reference to FIG. 10, a suitable operating environment 1000 for implementing various aspects of this disclosure can also include a computer 1012. The computer 1012 can also include a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014. The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1016 can also include volatile memory 1020 and nonvolatile memory 1022. The basic input/output system (BIOS), containing the basic routines to transfer information between elements within the computer 1012, such as during start-up, is stored in nonvolatile memory 1022. Computer 1012 can also include removable/non-removable, volatile/non-volatile computer storage media. FIG. 10 illustrates, for example, a disk storage 1024. Disk storage 1024 can also include, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media. To facilitate connection of the disk storage 1024 to the system bus 1018, a removable or non-removable interface is typically used, such as interface 1026. FIG. 10 also depicts software that acts as an intermediary between users and the basic computer resources described in the suitable operating environment 1000. Such software can also include, for example, an operating system 1028. Operating system 1028, which can be stored on disk storage 1024, acts to control and allocate resources of the computer 1012.

System applications 1030 take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems. A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port can be used to provide input to computer 1012, and to output information from computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a means of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a computer, a server, a router, a network PC, a workstation, a microprocessor based appliance, a peer device or other common network node and the like, and typically can also include many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1050 refers to the hardware/software employed to connect the network interface 1048 to the system bus 1018. While communication connection 1050 is shown for illustrative clarity inside computer 1012, it can also be external to computer 1012. The hardware/software for connection to the network interface 1048 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
    a memory that stores computer executable components; and
    a processor that executes the computer executable components stored in the memory, wherein the computer executable components comprise:
        a simulation component that simulates operation of qubits in a subgraph topology of a graph representing a topology of a quantum circuit to determine a quantity of frequency collisions between the qubits; and
        a selection component that selects a quantum circuit topology based on the quantity of frequency collisions between the qubits.

2. The system of claim 1, wherein the subgraph topology comprises at least one of a two graph node topology, a three graph node topology, a multiple graph node topology, a rotated version of the subgraph topology, or a defined collision generating topology.

3. The system of claim 1, wherein the computer executable components further comprise:
    a model component that generates the graph, and wherein the graph comprises graph nodes representing the qubits and one or more graph edges coupled to the graph nodes representing one or more qubit coupling devices coupled to the qubits.

4. The system of claim 1, wherein the computer executable components further comprise:
    a match component that matches the subgraph topology to a collision generating topology.

5. The system of claim 1, wherein the computer executable components further comprise:
    a scale component that determines a quantity of one or more instances of the subgraph topology in the graph and determines a total quantity of frequency collisions corresponding to the topology of the quantum circuit based on the quantity of the one or more instances of the subgraph topology in the graph and the quantity of frequency collisions between the qubits in the subgraph topology.

6. The system of claim 1, wherein the computer executable components further comprise:
    a parameter component that determines one or more parameters corresponding to at least one of the qubits, the topology of the quantum circuit, or the quantum circuit that provide a defined yield.

7. The system of claim 1, wherein the selection component selects the quantum circuit topology from a plurality of quantum circuit topologies based on at least one of a defined yield or a defined quantity of frequency collisions between at least two qubits of one or more of the plurality of quantum circuit topologies, thereby facilitating at least one of improved efficiency or performance of at least one of the simulation component or the processor.

8. The system of claim 1, wherein the computer executable components further comprise:
    a scale component that determines a total quantity of frequency collisions corresponding to the topology of the quantum circuit.

9. A computer-implemented method, comprising:
    simulating, by a system operatively coupled to a processor, operation of qubits in a subgraph topology of a graph representing a topology of a quantum circuit to determine a quantity of frequency collisions between the qubits; and
    selecting, by the system, a quantum circuit topology based on the quantity of frequency collisions between the qubits.

10. The computer-implemented method of claim 9, wherein the subgraph topology comprises at least one of a two graph node topology, a three graph node topology, a multiple graph node topology, a rotated version of the subgraph topology, or a defined collision generating topology.

11. The computer-implemented method of claim 9, further comprising:
    generating, by the system, the graph, wherein the graph comprises graph nodes representing the qubits and one or more graph edges coupled to the graph nodes representing one or more qubit coupling devices coupled to the qubits.

12. The computer-implemented method of claim 9, further comprising:
    matching, by the system, the subgraph topology to a collision generating topology.

13. The computer-implemented method of claim 9, further comprising:
    determining, by the system, a quantity of one or more instances of the subgraph topology in the graph; and
    determining, by the system, a total quantity of frequency collisions corresponding to the topology of the quantum circuit based on the quantity of the one or more instances of the subgraph topology in the graph and the quantity of frequency collisions between the qubits in the subgraph topology.

14. The computer-implemented method of claim 9, further comprising:
    determining, by the system, one or more parameters corresponding to at least one of the qubits, the topology of the quantum circuit, or the quantum circuit that provide a defined yield.

15. The computer-implemented method of claim 9, wherein the selecting comprises:
    selecting, by the system, the quantum circuit topology from a plurality of quantum circuit topologies based on at least one of a defined yield or a defined quantity of frequency collisions between at least two qubits of one or more of the plurality of quantum circuit topologies, thereby facilitating at least one of improved efficiency or performance of the processor.

16. The computer-implemented method of claim 9, further comprising:
    determining, by the system, a total quantity of frequency collisions corresponding to the topology of the quantum circuit.

17. A computer program product facilitating quantum circuit topology selection based on frequency collisions between qubits, the computer program product comprising a computer readable storage medium having program instructions embodied therewith, the program instructions executable by a processor to cause the processor to:
    simulate, by the processor, operation of qubits in a subgraph topology of a graph representing a topology of a quantum circuit to determine a quantity of frequency collisions between the qubits; and
    select, by the processor, a quantum circuit topology based on the quantity of frequency collisions between the qubits.

18. The computer program product of claim 17, wherein the subgraph topology comprises at least one of a two graph node topology, a three graph node topology, a multiple graph node topology, a rotated version of the subgraph topology, or a defined collision generating topology.

19. The computer program product of claim 17, wherein the program instructions are further executable by the processor to cause the processor to:
    generate, by the processor, the graph, and wherein the graph comprises graph nodes representing the qubits and one or more graph edges coupled to the graph nodes representing one or more qubit coupling devices coupled to the qubits.

20. The computer program product of claim 17, wherein the program instructions are further executable by the processor to cause the processor to:
    match, by the processor, the subgraph topology to a collision generating topology.

21. The computer program product of claim 17, wherein the program instructions are further executable by the processor to cause the processor to:
    determine, by the processor, a quantity of one or more instances of the subgraph topology in the graph; and
    determine, by the processor, a total quantity of frequency collisions corresponding to the topology of the quantum circuit based on the quantity of the one or more instances of the subgraph topology in the graph and the quantity of frequency collisions between the qubits in the subgraph topology.

22. The computer program product of claim 17, wherein the program instructions are further executable by the processor to cause the processor to:
    determine, by the processor, a total quantity of frequency collisions corresponding to the topology of the quantum circuit.

23. A system, comprising:
    a memory that stores computer executable components; and
    a processor that executes the computer executable components stored in the memory, wherein the computer executable components comprise:
        a simulation component that simulates operation of qubits in multiple types of subgraph topologies of a graph representing a topology of a quantum circuit to determine quantities of different types of frequency collisions between the qubits; and
        a selection component that selects a quantum circuit topology based on the quantities of the different types of frequency collisions between the qubits.

24. The system of claim 23, wherein the computer executable components further comprise:
    a match component that matches one or more of the multiple types of subgraph topologies to one or more collision generating topologies, and wherein the multiple types of subgraph topologies comprise at least one of a two graph node topology, a three graph node topology, a multiple graph node topology, a rotated version of one of the multiple types of subgraph topologies, or a defined collision generating topology.

25. The system of claim 23, wherein the computer executable components further comprise:
    a scale component that determines a quantity of one or more instances of the multiple types of subgraph topologies in the graph and determines a total quantity of different types of frequency collisions corresponding to the topology of the quantum circuit based on the quantity of the one or more instances of the multiple types of subgraph topologies in the graph and the quantities of the different types of frequency collisions between the qubits in the multiple types of subgraph topologies.

26. The system of claim 23, wherein the computer executable components further comprise:
    a scale component that determines a total quantity of different types of frequency collisions corresponding to the topology of the quantum circuit.

27. A computer-implemented method, comprising:
    simulating, by a system operatively coupled to a processor, operation of qubits in multiple types of subgraph topologies of a graph representing a topology of a quantum circuit to determine quantities of different types of frequency collisions between the qubits; and
    selecting, by the system, a quantum circuit topology based on the quantities of the different types of frequency collisions between the qubits.

28. The computer-implemented method of claim 27, further comprising:
    matching, by the system, one or more of the multiple types of subgraph topologies to one or more collision generating topologies, wherein the multiple types of subgraph topologies comprise at least one of a two graph node topology, a three graph node topology, a multiple graph node topology, a rotated version of one of the multiple types of subgraph topologies, or a defined collision generating topology.

29. The computer-implemented method of claim 27, further comprising:
- determining, by the system, a quantity of one or more instances of the multiple types of subgraph topologies in the graph; and
- determining, by the system, a total quantity of different types of frequency collisions corresponding to the topology of the quantum circuit based on the quantity of the one or more instances of the multiple types of subgraph topologies in the graph and the quantities of the different types of frequency collisions between the qubits in the multiple types of subgraph topologies.

30. The computer-implemented method of claim 27, further comprising:
- determining, by the system, a total quantity of different types of frequency collisions corresponding to the topology of the quantum circuit.

\* \* \* \* \*